US008099854B2

(12) United States Patent
Kato et al.

(10) Patent No.: US 8,099,854 B2
(45) Date of Patent: Jan. 24, 2012

(54) MANUFACTURING METHOD OF AN ELECTROMECHANICAL TRANSDUCER

(75) Inventors: Ayako Kato, Kawasaki (JP); Chienliu Chang, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 257 days.

(21) Appl. No.: 12/488,588

(22) Filed: Jun. 22, 2009

(65) Prior Publication Data

US 2009/0313808 A1 Dec. 24, 2009

(30) Foreign Application Priority Data

Jun. 24, 2008 (JP) ................................ 2008-165067

(51) Int. Cl.
*G01R 3/00* (2006.01)

(52) U.S. Cl. ........ 29/595; 29/594; 29/609.1; 73/504.04; 73/504.12; 73/504.13; 73/504.14; 310/330; 310/331; 310/332; 310/340; 333/186; 333/187; 333/189

(58) Field of Classification Search ................. 29/592.1, 29/594, 595, 609.1, 836, 846; 73/504.04, 73/504, 12–504.16; 310/330–332, 340, 344, 310/345; 333/186–189
See application file for complete search history.

(56) References Cited

U.S. PATENT DOCUMENTS

| | | | | |
|---|---|---|---|---|
| 2009/0313809 | A1 * | 12/2009 | Kato et al. | 29/594 |
| 2009/0320274 | A1 * | 12/2009 | Kato et al. | 29/596 |
| 2010/0207484 | A1 * | 8/2010 | Chang | 310/300 |

FOREIGN PATENT DOCUMENTS

| | | |
|---|---|---|
| JP | 2007-188967 A | 7/2007 |

OTHER PUBLICATIONS

Xuefang Zhuang, Sensors and Actuators A 138 (2007) 221-229, "Integration of trench-isloated through-wafer interconnects 2-d capacitive micromachined ultrasonic transducer arrays".

* cited by examiner

*Primary Examiner* — Paul D Kim
(74) *Attorney, Agent, or Firm* — Cannon U.S.A., Inc., IP Division

(57) ABSTRACT

A groove is formed on a handling member, on a face to be fixed to an element, the groove making up a portion of a channel that externally communicates in the state of being fixed to the element. In the fixing process of the substrate and then handling member, the handling member is fixed so that the edge direction of the vibrating membrane supporting portion and the edge direction of the groove of the handling member intersect. Thus, the probability that a membrane will break during handling or processing of the substrate is reduced, and the handling member can be quickly removed from the substrate.

6 Claims, 17 Drawing Sheets

MANUFACTURING METHOD OF AN ELECTROMECHANICAL TRANSDUCER

BACKGROUND OF THE INVENTION

1. Field of the Invention

The present invention relates to an electromechanical transducer and a fabrication method of an electromechanical transducing apparatus.

2. Description of the Related Art

Recently, research pertaining to electromechanical transducers using micromachining has been widely conducted. Particularly, a capacity-type of electromechanical transducer is a device to transmit or receive elastic waves such as ultrasonic waves using a lightweight thin film, and a wide bandwidth is readily obtained whether in liquid or in air, thereby has received focus as a technique more desirable for high-precision ultrasound wave diagnosis than current medical diagnostic modality.

Such a capacity-type electromechanical transducer is made up of elements wherein multiple cells having a substrate, a thin film which is a vibrating membrane, and a vibrating membrane supporting portion, are formed and electrically connected. An electromechanical transducing apparatus is fabricated by electrically bonding an integrated circuit to a substrate serving as the electromechanical transducer. However, since the substrate itself is thin and mechanical strength thereof is low, there has been the problem of easily breaking during handling or processing at the time of fabrication. Also, the substrate detects a signal for each element, and therefore may perform trench formation to form a recessed portion by removing a portion of the back face of the face whereupon the vibrating membrane is formed by shaving, polishing, etching, and so forth. By performing such trench formation, lower electrodes can be separated by element, but the substrate has a thin substrate itself, which the trench formation causes to be thinner still, whereby performing further back-face processing with the substrate alone becomes difficult.

Now, Sensors and Actuators A 138 (2007) 221-229 describes a technique wherein, in order to protect the vibrating membrane and to strengthen the substrate itself, a quartz substrate is used as a handling member, which is fixed to the surface of the vibrating membrane side of the substrate, via a dry film. Subsequently, trench formation and fabrication of a lower electrode is performed on the back face of the fixed face with the quartz substrate, and flip chip bonding is used to electrically bond with the integrated circuit. Lastly, the quartz substrate using for handling is removed and the element surface is exposed to fabricate the electromechanical transducing apparatus.

Also, Japanese Patent Laid-Open No. 2007-188967 discloses a substrate processing method which, although differing from the electromechanical transducer, provides a channel to the handling member and supports the substrate, and performs back-face processing and the like of the substrate. By forming a metallic layer on the channel of the handling member, in the event that the handling member is removed, an acid or alkali dissolving solution to dissolve metal is supplied to the channel, whereby the handling member is separated from the substrate.

SUMMARY OF THE INVENTION

In Sensors and Actuator A 138 (2007) 221-229, a flat quartz substrate is employed as a handling member, and is fixed to a substrate via a dry film (adhesive agent). Therefore, in order to remove the handling member, when placing acetone on the adhesive face to separate, there may be cases wherein the acetone cannot permeate to the center portion of the adhesive face and cannot remove the handling member, or cases wherein the vibrating membrane breaks due to swelling of the adhesive. In the case of removing the handling member by mechanical polishing, precise control is required, and this also takes time.

Also, in Japanese Patent Laid-Open No. 2007-188967, a channel is provided to the handling member, but the direction of fixing the handling member in relation to the element of the substrate is not taken into consideration. In the case of a substrate having a vibrating membrane, even if the handling member is fixed, in the case of including a rectilinear edge to the channel, depending on the fixing method of the handling member the vibrating membrane has the possibility of breaking.

Thus, with the present invention, the probability of the vibrating membrane breaking at the time of removing the handling member can be decreased by regulating the fixing direction of the handling member based on the relation to the space, even in a case of having a rectilinear edge to the channel.

In order to solve the above-mentioned problems, a manufacturing method of an electromechanical transducer is provided with the following features. That is to say, a manufacturing method of an electromechanical transducer having an element includes: a substrate; a vibrating membrane; and a vibrating membrane supporting portion to support the vibrating membrane so that a space is formed between the substrate and the vibrating membrane; the manufacturing method including a fixing procedure to fix a handling member to a face on the vibrating membrane side within the faces of the elements; a back face processing procedure to process the face on the opposite side from the vibrating membrane side within the faces of the elements; and a removal procedure to remove the handling member from the element, wherein the handling member has a groove including a rectilinear edge on the face to fix to the element, and in the fixing procedure, configures a portion of a channel to externally communicate in the state of the groove being fixed to the element, wherein the handling member is fixed so that the edge direction of the vibrating membrane supporting portion and the edge direction of the groove of the handling member intersect, and wherein a solution for removing the handling member from the element in the removal procedure is supplied to the groove.

According to the present invention, removal of the handling member can be performed quickly. Also, the probability of breakage of the vibrating membrane at the time of removing the handling member can be reduced, whereby yield at the time of manufacturing can be improved.

Further features of the present invention will become apparent from the following description of exemplary embodiments with reference to the attached drawings.

DESCRIPTION OF THE EMBODIMENTS

Embodiments of the present invention will be described below with reference to the appended drawings. An electromechanical transducer according to the present invention is not limited to the capacity-type electromechanical transducer; rather, any type may be used as long as of a similar configuration. For example, an electromechanical transducer using a detecting method with distortion, magnetic field, or light may be used.

Figure 1A:
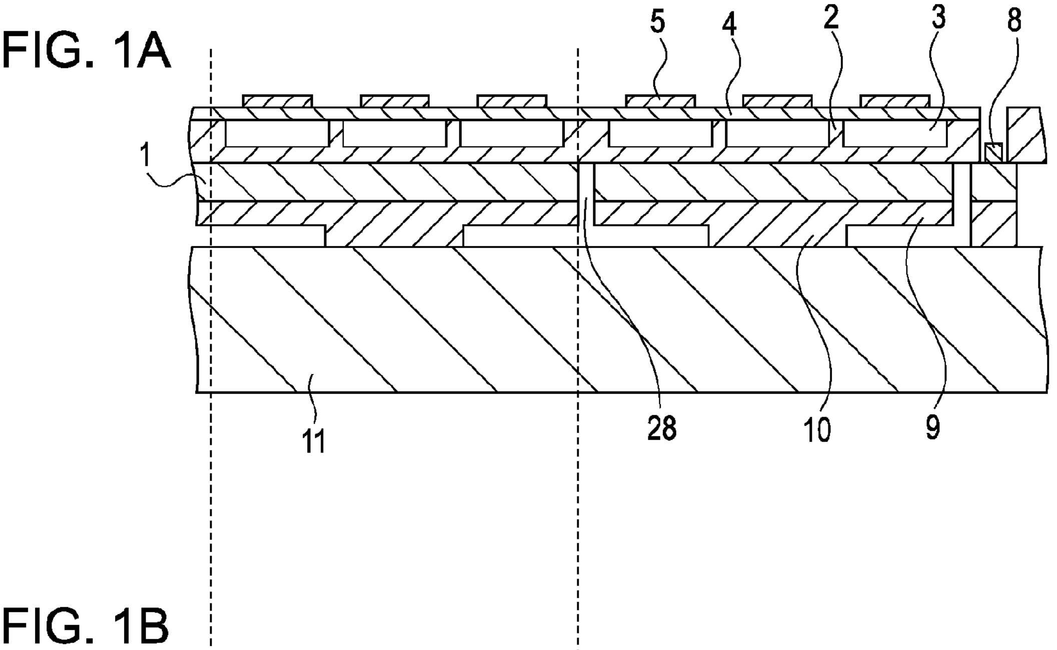
FIGS. 1A and 1B are schematic diagrams of a basic configuration of an electromechanical transducing apparatus.
Figure 1B:
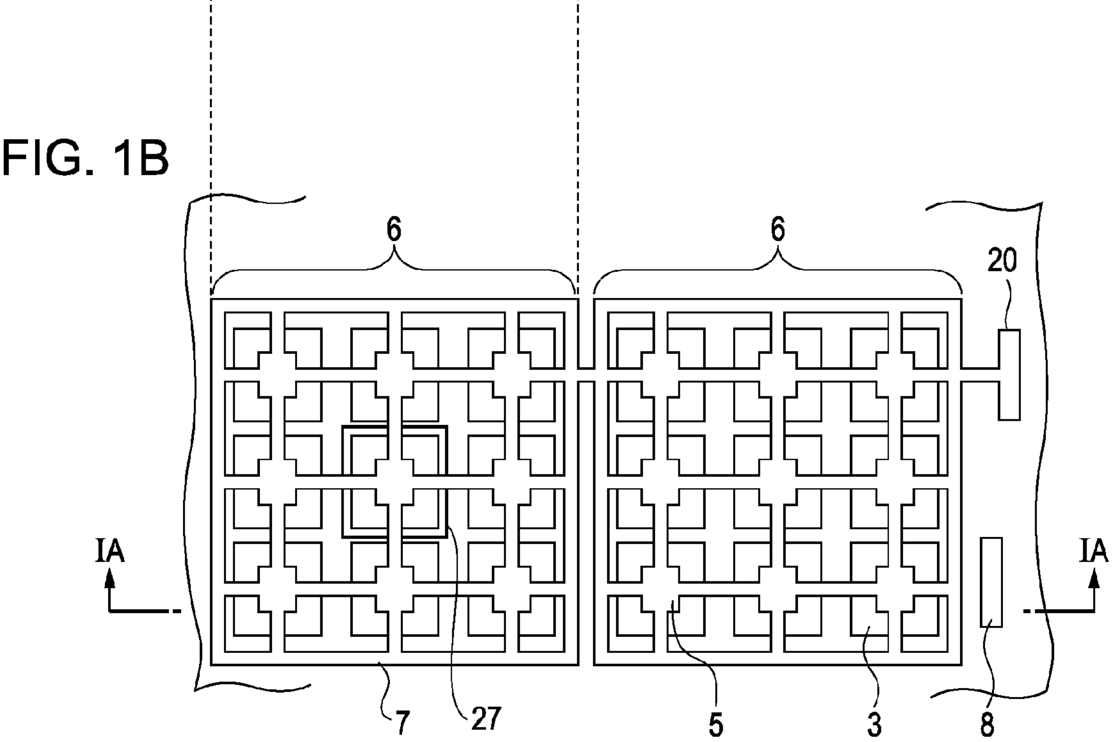

FIGS. 1A and 1B are an example of a configuration of an electromechanical transducing apparatus. FIG. 1A is a cross-sectional schematic diagram, and FIG. 1B is an upper face schematic diagram. The cross-section at the IA-IA line in FIG. 1B is FIG. 1A. In FIG. 1A shows a membrane 4 which is a vibrating membrane on top of a substrate 1, and a membrane supporting portion 2 to support the membrane 4 (i.e. a vibrating membrane supporting portion). Also, a cavity 3 which is a space between the membrane 4 and the membrane supporting portion 2 is formed, and an upper electrode 5 is formed on the membrane 4. The cavity only needs to be formed between the substrate and the membrane, and an insulating film may be formed so as to become a portion of the membrane supporting portion 2 on the substrate. In the case also that the substrate and membrane supporting portion for integrated (in the case of forming a membrane supporting portion by forming a recessed portion on the substrate), the portion supporting the membrane becomes the membrane supporting portion. In the case of FIGS. 1A and 1B, a cell 27 is made up of the substrate 1, membrane 4, membrane supporting portion 2, cavity 3, upper electrode 5, and a lower electrode 9. The upper electrode 5 may be provided to at least one location of the upper portion, back face, and inner portion of the membrane 4, or the membrane 4 itself may be the upper electrode. An aggregate wherein at least one or two or more cells have collected and electrically bonded is called and element (element 6). The element 6 can be formed on one mechanical electric converting element at a desired location. In the case of FIGS. 1A and 1B, there are two elements 6 wherein nine cells 27 have been collected. The region of the element 6 is a region surrounded by the solid line in FIG. 1B, and of the cells making up the element 6, is the region surrounded by the outermost wall of each cell making up the outermost circumference. Each element is electrically separated from the other elements. With the present embodiment, the potential of the upper electrode 5 is common across all of the elements, and is spread throughout an upper electrode pad 20. The lower electrodes which are made up of the substrate 1 and lower electrode 9 are electrically separated by the trench 28 separating each element 6. The numeral 7 denotes the width of the element. The mechanical vibration received by each cell of each element 6 is converted to an electric signal for each element, and is transmitted from the lower electrode, which is made up of the substrates 1 separated by the trenches 28 and the lower electrode layer 9 for taking out the signal, to the integrated circuit 11, via a bump 10 which is an electrical contact point. The upper electrode 5 is provided in an array for each element. With the present invention, the electromechanical transducer and the integrated circuit make up the electromechanical transducing apparatus.

In FIGS. 1A and 1B, the positions of the lower electrode pad 8 and upper electrode pad 20, as well as the wiring on the upper electrode, can be provided to an appropriate desired position.

Figure 2A:
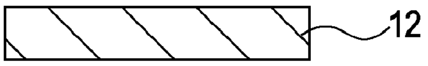
FIGS. 2A through 2H are fabrication flow schematic diagrams of a substrate.
Figure 2B:
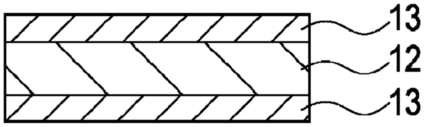

Next, an example of a substrate fabrication procedure to fabricate a substrate is shown with reference to FIGS. 2A and 2B. In FIGS. 2A and 2B, as an example, a one-cell-one-element fabrication method is shown.

Figure 2C:
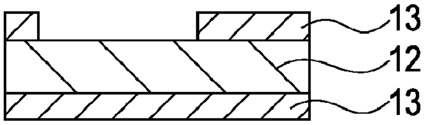
Figure 2D:
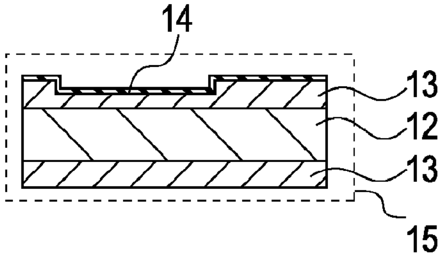

As shown in FIG. 2A, a cleaned silicon substrate 12 is prepared. Next, as shown in FIG. 2B, the silicon substrate 12 is placed in a thermal oxidation furnace to form a thermally oxidized film 13. The thermally oxidized film 13 becomes the portion wherein a cavity is formed (membrane supporting portion), whereby the thickness of the thermally oxidized film 13 is desirable to be in the range of 10 nm through 4000 nm, the range of 20 nm through 3000 nm is more desirable, and the range of 30 nm through 2000 nm is most desirable. Next as shown in FIG. 2C, the thermally oxidized film 13 is subjected to patterning. Next as shown in FIG. 2D, a second thermal oxidation procedure is performed, whereby an insulating film 14 is formed as a thin oxidized film. In order to secure insulation, the thickness of the insulating film 14 is desirable to be in the range of 1 nm through 500 nm, the range of 5 nm through 300 nm is more desirable, and the range of 10 nm through 200 nm is most desirable. In order to simplify the description of the procedures hereafter, the substrate having completed the procedures through FIG. 2D will be called an A substrate 15.

Next, a SOI (Silicon On Insulator) substrate 26 is cleaned and prepared. The SOI substrate 26 is a substrate with a configuration in which an oxidized film (hereafter called BOX (Buried Oxide) layer 17) has been introduced between the silicon substrate (hereafter called handling layer 18) and surface silicon layer (hereafter called device layer 16). The device layer 16 of the SOI substrate is a portion serving as the membrane. As an electromechanical transducer performing transmitting/receiving of ultrasound waves, a frequency bandwidth of 1 MHz through 20 MHz is desirable, and as a thickness of a membrane that can obtain such frequency bandwidth is obtained from relations such as a Young's modulus, density, or the like. Therefore, as a thickness of the device layer 16, 10 nm through 5000 is desirable, 20 nm through 3000 nm is more desirable, and the range of 30 nm through 1000 nm is most desirable.

Figure 2E:
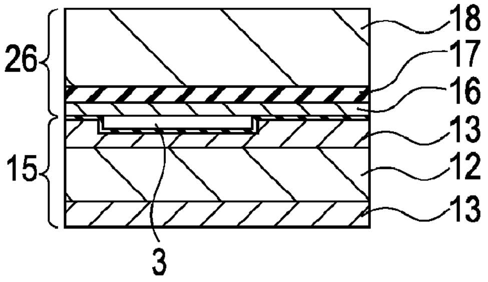

The SOI substrate herein is positioned together and bonded on top of the A substrate 15 so that the thermally oxidized film 13 and the device layer 16 are mutually in contact (to be on the inner side), whereby the cavity 3 is formed of the device layer 16 and the thermally oxidized film 13, as shown in FIG. 2E. Pressure conditions for the bonding procedure include ambient atmosphere, however, bonding in a vacuum atmosphere is preferable, since displacement of the membrane is limited while driving when air exists in the cavity, due to the cushioning effects of the air. By bonding in a vacuum, the membrane bends in the initial state, whereby only a small bias voltage is necessary at the time of driving. In the case of bonding in a vacuum, $10^4$ Pa or lower is desirable, $10^2$ Pa or lower is more desirable, and 1 Pa or lower is most desirable.

Note that the device layer 16 and thermally oxidized film 13 of the SOI substrate are dehydrated and condensed by heat processing and bonded. Therefore, the temperature of the bonding procedure is a temperature higher than room temperature, but if too high, the composition of the substrate may change, so a range of 1200° C. or less is desirable, 80° C. to 1000° C. is more desirable, and 150° C. to 800° C. is most desirable.

Figure 2F:
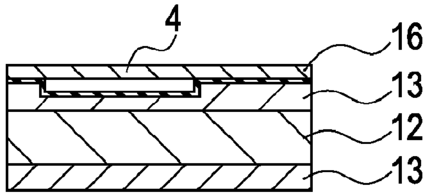

Subsequently, a LPCVD SiN film is formed over the entire surface of the substrate to be bonded, and only the LPCVD SiN film on the surface of the handling layer 18 on the SOI substrate side is removed by a method such as dry etching. Next, the handling layer 18 is subjected to wet etching by a heated alkali fluid. The alkali etching fluid has an extremely high Si-to-$SiO_2$ etching selection ratio (in the range of roughly 100 to 10,000), whereby the wet etching selectively etches to remove the handling layer 18, and stops at the BOX layer 17. Subsequently, using a fluid including hydrofluoric acid is used to etch and remove the BOX layer 17, whereby the state shown in FIG. 2F is formed. Wet etching is desirable as a removal method of the handling layer and BOX layer, but machine polishing or dry etching methods may also be used.

Note that in the case of bonding at a pressure lower than that of the atmospheric pressure, the device layer 16 of the substrate is deformed so as to bend in the substrate side by the atmospheric pressure, becoming in a recessed state. That is to say, the device layer 16 remains in a recessed state while in a state of not applying any particular external force, and becomes the membrane 4 of the electromechanical transducer.

Figure 2G:
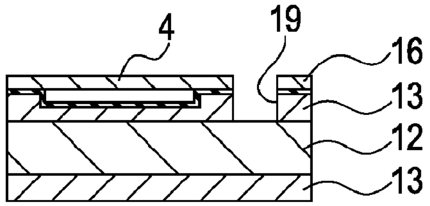

Next, the device layer 16 making up the membrane 4 is subjected to patterning by dry etching at a position where no cavity exists. The oxidizing film 13 is directly subjected to patterning by wet etching without removing the photoresist for patterning. With this procedure, an etching hole 19 is formed, as shown in FIG. 2G. The hole is preferably formed by wet etching as described above, but methods such as machine polishing or dry etching may be used.

Figure 2H:
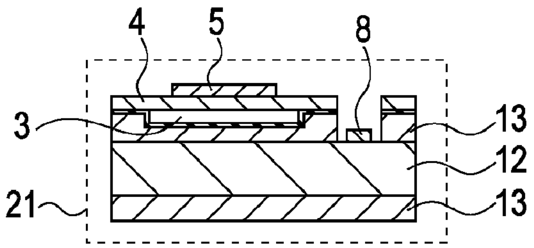

Next, a metallic film for use as an electrode is formed and subjected to patterning, and an unshown upper electrode pad and the upper electrode 5 and lower electrode pad 8 shown in FIG. 2H are formed. The substrate 21 can be thus fabricated. Note that the locations of the upper electrode pad and lower electrode pad may be provided at desired locations. Also, metals such as Al, Cr, Ti, Au, Pt, Cu and the like can be used for the metallic film.

In the case of an electromechanical transducer used for transmitting/receiving ultrasound waves, the bending of the membrane 4 is several hundred nm or less, while the cell dimensions (e.g. the diameter of the membrane 4) is several tens to several hundred μm. Therefore, with exposure processing in the patterning procedure for the metallic film, the membrane bending is smaller than the depth of focus of a normal exposure apparatus, whereby the metallic film can be provided without any exposure shift occurring such as light diffraction.

As shown in FIG. 2H, the silicon substrate 12 can be employed as the lower electrode. In the case that the silicon substrate 12 is not the lower electrode, a lower electrode having high conductivity can be embedded between the substrate 1 in FIG. 1A and the cavity base face. Also, in the case that the membrane is of an insulating material or in the case that an insulating film is formed on the cavity base face, a lower electrode can be provided on the cavity base face.

Another layer of insulating film, e.g. an insulating film made up of at least one dielectric material such as SiN, $SiO_2$, SiNO, $Y_2O_3$, HfO, HfAlO and the like, can be provided to the membrane 4, and the upper electrode can be disposed further on top of the insulating film herein. Also, with the present embodiment, the membrane 4 uses silicon, but the membrane 4 may be an insulating material, in which case the insulating film 6 with a high-permittivity material such as a SiN film does not have to be disposed. In this case, providing the upper electrode on top of the membrane 4 is desirable.

Further, with the present embodiment, the substrate is fabricated with the above-described procedure, but the substrate can also be fabricated by employing a MEMS technique such as surface micromachining (a method to form a cavity by removing a sacrificial layer such as the metallic layer).

Note that the cross-sectional diagram shown in FIG. 2H is an example of the electromechanical transducer, but in order to simplify the diagram, protective film for electric wiring or electric wiring between the upper electrode 5 and the upper electrode pad 20 and so forth are not shown in the diagram.

FIGS. 3A through 3G show an example of a method to fix a handling member, wherein a channel is formed by providing a groove, to the substrate and fabricate an electromechanical transducing apparatus. In order to simplify in FIG. 3A through 3G, a portion of the electromechanical transducer is enlarged and shown as a schematic diagram.

Figure 3A:
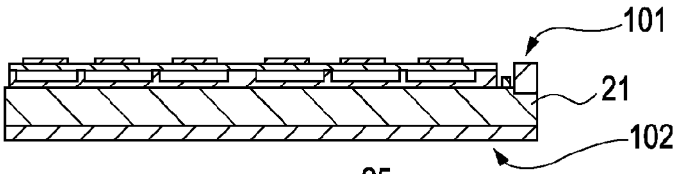
FIGS. 3A through 3G are fabrication flow schematic diagrams of an electromechanical transducing apparatus.

As shown in FIG. 3A, a substrate 21, which is fabricated by the substrate fabrication procedure in FIGS. 2A through 2H is prepared. Now, of the faces having a substrate, using the cavity as a base, let us say that the face on the membrane side is a "first face" and the face on the opposite side of the first face is a "second face". In the diagram, reference numeral 101 denotes the first face and 102 denotes the second face.

Figure 3B:
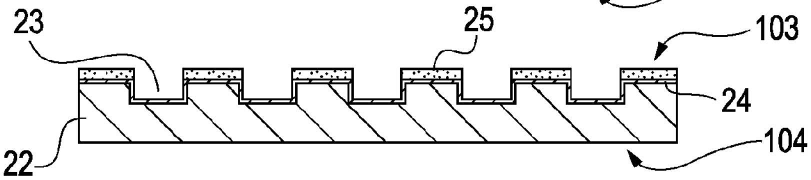

On the other hand, a handling member 22 is prepared by the handling member fabrication procedure as shown in FIG. 3B. The handling member 22 in FIG. 3B has provided a metallic layer 24 and adhesive layer 25 on top of the handling member. Now, of the faces having a handling member, let us say that the face on the side fixed to the substrate is a "third face" and the face on the opposite side of the third face is a "fourth face". In the diagram, the reference numeral 103 denotes the third face and 104 denotes the fourth face. Also, the handling member has a groove formed on the third face so as to be a channel in the state of being fixed to the substrate. With the present invention, only a case wherein the groove has a rectilinear edge is considered. With the description hereafter, in the case of expressing the recessions/protrusions of the third face formed with the groove, the portion equating to the groove is called a "channel recessed portion" and the portion existing between a channel recessed portion and a channel recessed portion is called a "channel protruding portion". However, in the case that the term "channel" is used alone, this indicates a groove, as in the normal sense of the word, or a supply path for fluid that is provided by forming a groove. Also, in the case that a through hole is provided from the third face to the fourth face, the portion of the hold is equivalent to the channel recessed portion, and the third face other than the hole is equivalent the channel protruding portion. Also, the edge of the groove is an angle of the channel protruding path, and is a line formed by a channel protruding portion on the third face. A face other than the third face (e.g., the fourth face, or another face) communicates with at least one external location by way of these channels. Examples of material suitable for the handling material 22 include quartz substrates, silicon wafers, and so on. A desired channel 23 can be provided to these base materials by dicing, etching, laser processing, sandblasting, or the like.

Figure 3C:
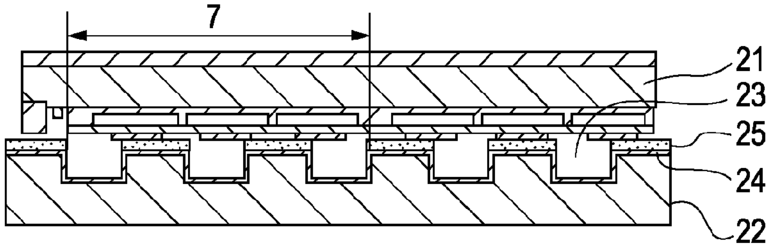

FIG. 3C illustrates a fixing procedure to fix the handling member to the substrate. With the fixing procedure herein, if the direction to fix the handling process is not considered, in the event that the groove formed on the handling member has a rectilinear edge, the membrane may break. Although described in detail later, with the present invention, the edge direction of the membrane supporting portion of the substrate 21, and the edge direction of the groove on the handling member, are fixed so as to intersect with one another (so as to be non-parallel). The "edge direction of the membrane supporting portion" indicates the edge direction of a membrane supporting portion with the face that the membrane and membrane supporting portion are intersecting (i.e. the face that the membrane supporting portion is in contact with the membrane). That is to say, the direction of the periphery of the cavity at the cavity opening portion. The "edge direction of the groove" indicates the edge direction of the groove as to the third face (i.e. the face of the channel protruding portion fixed to the substrate). That is to say, the edge direction of the channel as to the third face.

Figure 3D:
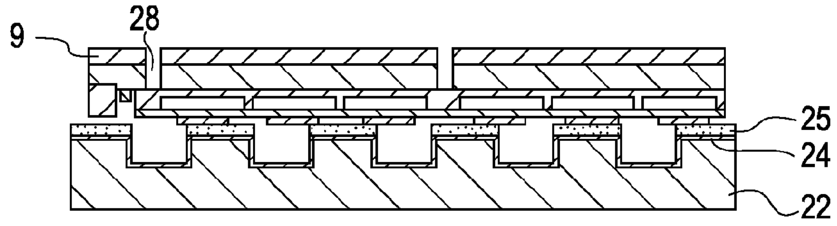
Figure 3E:
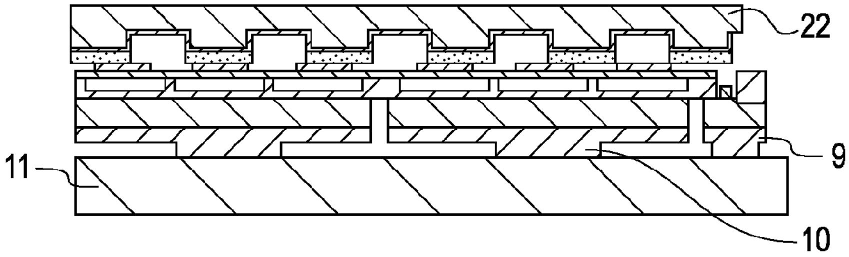

FIGS. 3D and 3E illustrate procedures to process the second face (hereafter called a back face processing procedure). In FIG. 3D, the silicon substrate 12 is cut down to a desired thickness, and a lower electrode layer 9 serving as the lower electrode is formed on the surface of the second face after cutting. Subsequently, trench formation is performed to form a trench 28 for each element 6. By supporting the substrate with the handling member, the strength to endure the trench formation can be increased. Additionally, by covering the membrane with a handling member, the membrane is not exposed, and can be protected from an unexpected collision or the like during the process.

FIG. 3E shows a procedure to perform flip chip bonding (one procedure within the back face processing procedure). A bump 10 is formed on the integrated circuit 11, and an electromechanical transducer which is a substrate to be processed that has already been subjected to trench formation is bonded thereto.

Figure 3F:
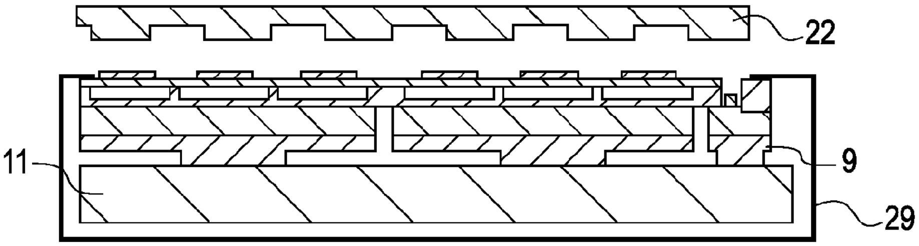

FIG. 3F shows a removal procedure to remove the handling member from the substrate after the flip chip bonding. In order to remove the handling member from the substrate, a solution is supplied to the channel so as to separate the two. Here, since a metallic layer 24 is formed, the handling member is removed by an acid or alkali dissolving solution that will dissolve the metallic layer 24 being supplied to the inner portion of the channel 23. As a method for supplying the dissolving solution to the channel, the dissolving solution may be supplied just to the channel 23, or the portion from the upper electrode 5 to the integrated circuit 11 may be protected with a protective case 29, and immersed in the dissolving solution with the handling member fixed thereto. The contact portions between the protective case 29 and the side of the substrate that has already been subjected to back side processing differs in reality from FIG. 3F, and contact is made at a location sufficiently distanced from the element.

Figure 3G:
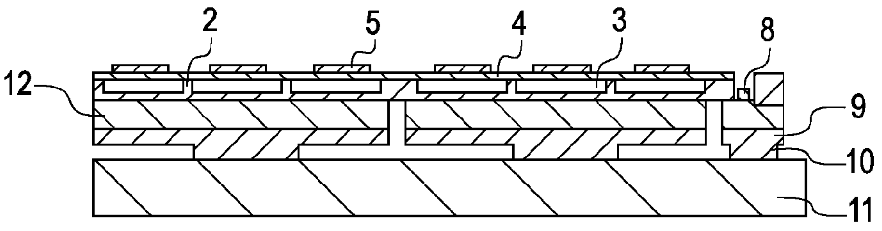

With the above-described procedure, an electromechanical transducing apparatus such as shown in FIG. 3G is completed.

Figure 4A:
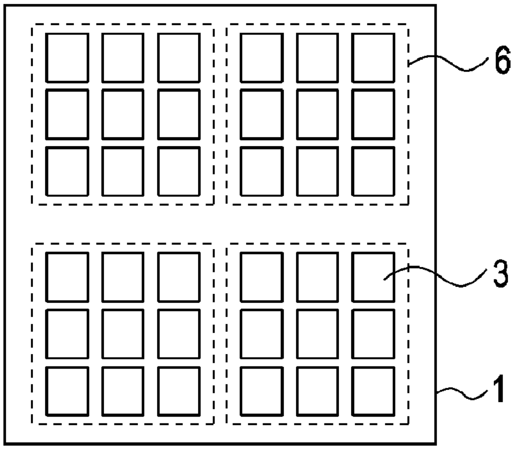
FIGS. 4A through 4C illustrate an example of a cavity form of an electromechanical transducer (upper face diagram).
Figure 4B:
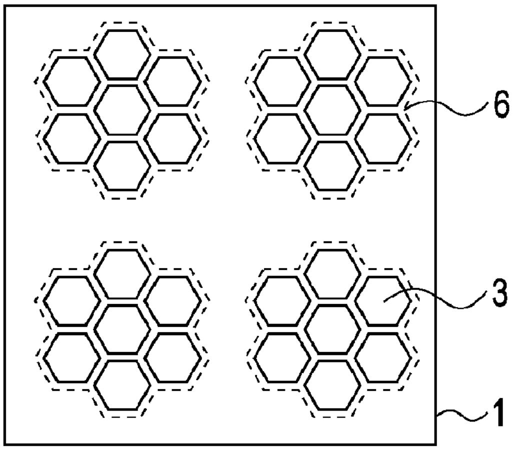
Figure 4C:
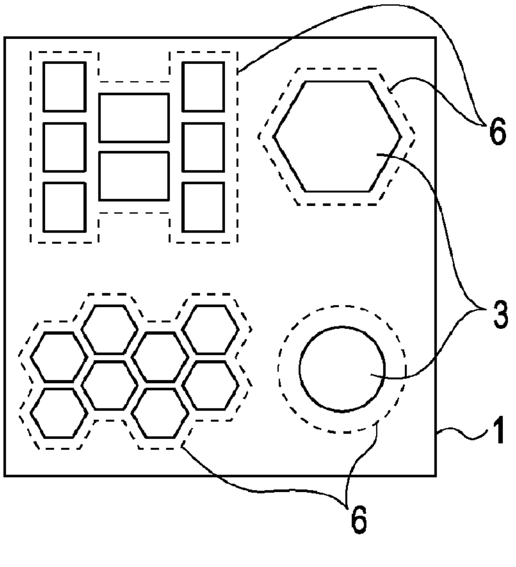

Next, the cavities and elements of an electromechanical transducer to which the present invention can be applied is described in detail with reference to FIGS. 4A through 4C. FIGS. 4A through 4C are schematic diagrams of the contact face with the membrane of the cavity of the electromechanical transducer (upper face diagram). In FIGS. 4A through 4C, the membrane, upper electrodes, and so forth are omitted.

In FIG. 4A, cells having a quadrangle cavity are disposed in a three rows by three columns array. These nine cells make up one element 6. One electromechanical transducer is made up by disposing two rows and two columns of the element 6. The cavities 3 and elements 6 can be disposed in a desired size and position. The form of the cavity 3 on the contact face with the membrane may be a quadrangle as shown in FIG. 4A, or may be a polygon such as a hexagon as shown in FIGS. 4B and 5C, whereby a desired shape can be provided. In the case that the form of the membrane supporting portion of the contact face with the membrane is made up of straight lines and curved lines, as to the edge direction of the membrane supporting portion, only the direction showing a straight line becomes the edge direction of the membrane supporting portion.

Also, it is desirable for the ratio of the area of the cavity-forming portion (i.e. the movable portion of the membrane) as to the entire device is great, and it is desirable for the output of each cavity to be uniform. This is because the effective area of the element for each unit area of a transducer becomes great, and the precision and sensitivity of transmitting/receiving the ultrasound waves becomes high. Therefore, for a cavity form of the contact face with the membrane, it is desirable that a shape be used wherein the same shape can be packed closely together, such as a quadrangle or hexagon. Also, only a desired number of cavities 3 (the number of cells) making up the element 6 have to be provided. Cavities having different forms and sizes can also be provided within the electromechanical transducer as shown in FIG. 4C. Further, the disposal of the cavities (disposal of the cells) can be disposed in a matrix shape or in a staggered pattern, or in a desired disposal form.

Figure 5:
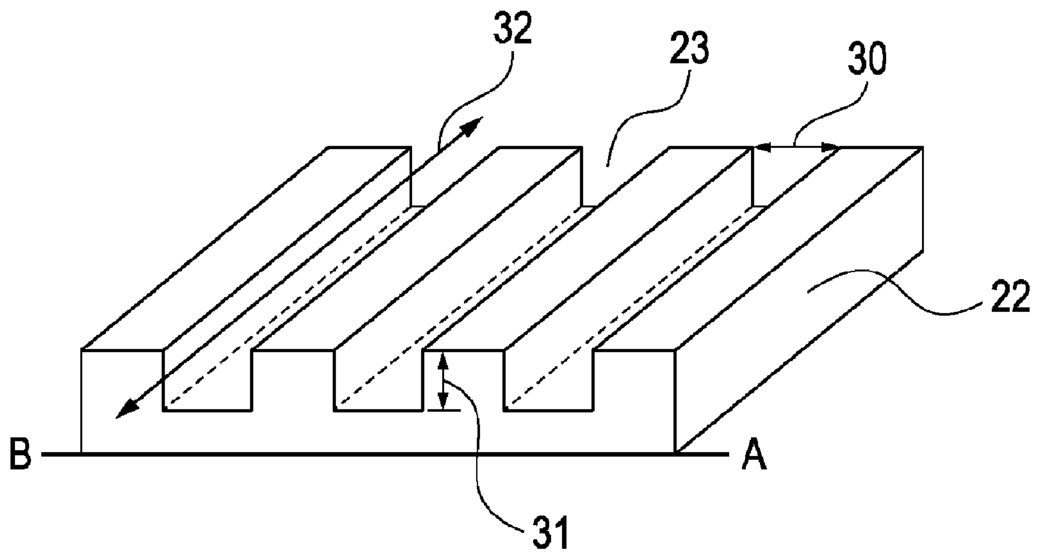
FIG. 5 is an example of a handling member provided with a channel (rectilinear).

The handling member provided with a channel will be described in detail with reference to FIGS. 5 through 9. FIG. 5 is a perspective view of an example of a handling member provided with a channel. The base material for the handling member may be a material such as the following. Various types of glass substrates such as synthetic quartz or Pyrex (registered trademark), a semiconductor substrate such as a silicon wafer, or a plastic substrate or metallic substrate may be used, as long as the substrate has a certain amount of rigidity. Of these, considering the flatness of the substrate and ease of processing, a quartz substrate, silicon wafer, photosensitive glass substrate, or the like is desirable.

The channel shape on the third face may be in various shapes such as a rectilinear shape, a grid shape, a radiating shape, a wave shape, a hole shape, a staggered shape, a honeycomb shape and so forth. Even in the case that the channel is made up only from a hole that passes through from the third face to the fourth face, and the hole and hole are not connected, we can say that the spread of the hole in the third face is the channel width, and that a channel is formed. Reference numeral 32 in the diagram indicates the edge direction of the groove. Now, in the case that the edges of the channel on the third face is made up not only of straight lines but also of curved lines, regarding the edge direction of the groove, only the direction indicated by the straight lines will be the edge direction of the groove. However, the shape made up only from straight lines includes a shape that is made up by straight lines intersecting and broken lines also.

Figure 6:
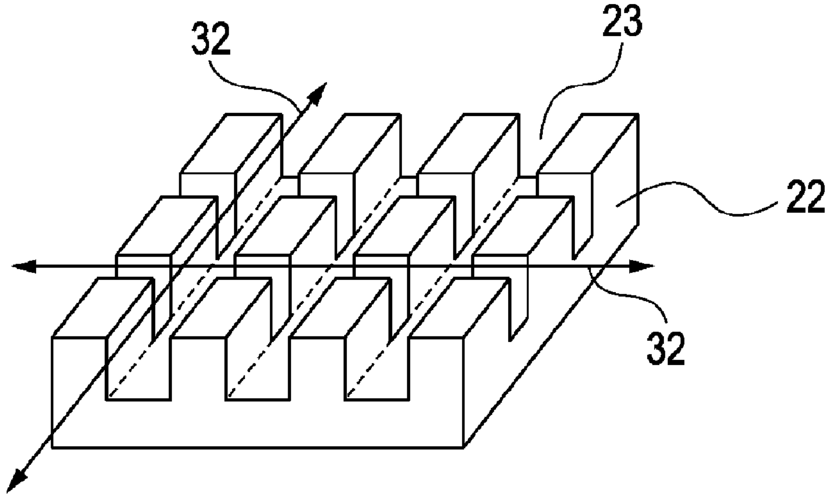
FIG. 6 is an example of a handling member provided with a channel (grid).

Also, a shape wherein the channels made up of straight lines are parallel or orthogonal, such as the straight line shape as in FIG. 5 or the grid shape as in FIG. 6, is more desirable. If the shape is such that the channels made up of straight lines are parallel or orthogonal, the edge direction of the membrane supporting portion and the edge direction of the groove of the handling member can be readily fixed so as to intersect.

Figure 7:
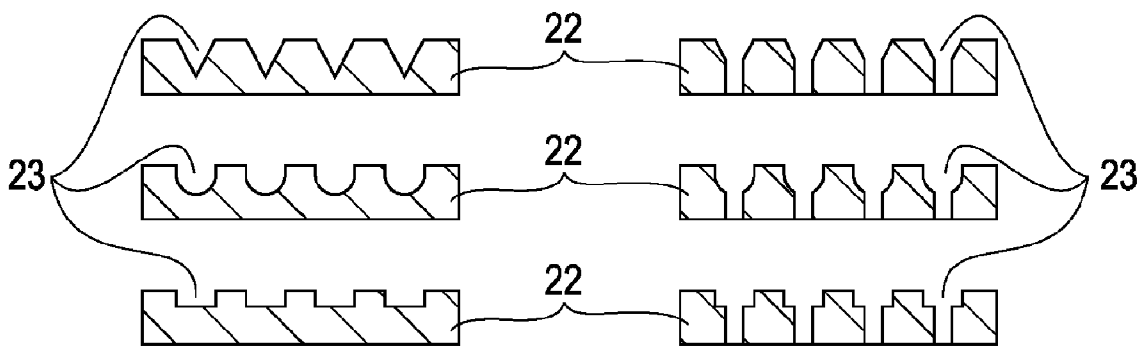
FIG. 7 is an example of a handling member provided with a channel (cross-sectional diagram).

FIG. 7 shows an example of a cross-sectional diagram of a handling member providing a hole in the channel (cross-sectional diagram in the direction perpendicular as to the third face). By combining the channels and holes, the dissolving solution can more readily permeate in the procedures to remove the substrate and the handling member, whereby this is a desirable configuration in that the handling member can be quickly removed. Also, regarding the cross-sectional shape in the direction perpendicular to the third face may be various shapes such as a half-moon, quadrangle, or triangle. The shape herein may be selected as appropriate, according to the features of the substrate used and the method of providing the channel.

Regarding a method to provide the channel, the channel can be formed by dry or wet etching employing a photolithography technique, a laser process, machining, sandblasting, or the like.

The size of the channel with the present invention only has to be the size that the dissolving solution can permeate the channels and support the elements, and therefore can be determined as appropriate with consideration for the strength of the handling member. The width of the channel recessed portion of the portion fixed to the element (i.e. the width of the groove) 30 is desirable to be 2000 μm or less, and the width of the channel protruding portion is desirable to be 20 μm or greater. The channel pitch (the width of an adjoining channel recessed portion and channel protruding portion) is desirable to be 4000 μm. Also, the groove serving as the channel is formed by a dicing process or laser process, whereby the depth of the channel (i.e. the depth of the groove) is desirable to be 10 μm or greater. Now, the width of the channel recessed portion and channel protruding portion refers to the width of the channel recessed portion and channel protruding portion on the third face, and the channel depth refers to the depth of the formed channel down to the deepest portion thereof.

Figure 8:
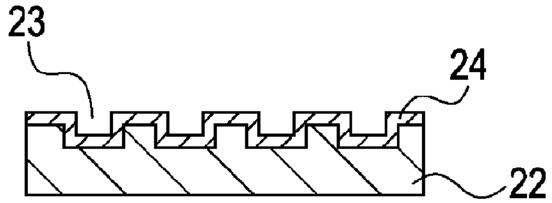
FIG. 8 is an example of a handling member provided with a metallic layer (cross-sectional diagram).

FIG. 8 is a diagram showing one metallic layer 24 provided on the channel recessed and protruding portions of the handling member. On top of providing the metallic layer 24, an adhesive layer is provided and fixed to the first face in FIG. 3A, whereby the handling member can be readily removed from the substrate. The metallic layer 24 is not particularly restricted as long as the metallic layer can be dissolved with an acid or alkali dissolving solution, but aluminum, germanium, titanium, indium and so forth can be used. Particularly aluminum and germanium can readily be deposited in a vacuum on the third face side with a method such as sputtering, and therefore are desirable. Also, a thin metallic layer 24 is more readily removed, whereby the thickness of the metallic later is desirable to be 10 μm or less, and 5 μm or less is more desirable. Further, the range of 1 to 2 μm is most desirable. As shown in FIG. 8, the metallic layer 24 can be provided over the entire third face, or metallic layer 24 can be provided over a portion of the third face. Also multiple metallic layers 24 may be provided. However, in the case that the upper electrode is formed within the element, it is desirable that a metal with an etching rate higher than the metal used for the upper electrode is used.

Figure 9:
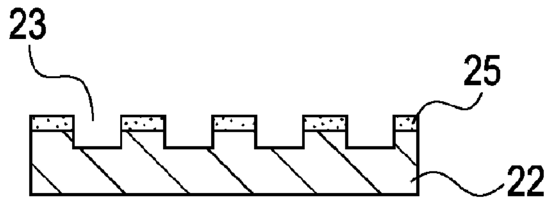
FIG. 9 is an example of a handling member provided with an adhesive layer (cross-sectional diagram).

FIG. 9 is a diagram showing an adhesive layer 25 provided on the channel protruding portion instead of providing the metallic layer 24. With the fixing method herein, the adhesive layer 25 only makes contact with a portion of the substrate to be processed 21, whereby the time it takes to remove the adhesive layer 25 can be shortened, and is therefore desirable. In this case, a dissolving solution such as an organic solvent that can dissolve the adhesive layer 25 should be used to remove the handling member. The adhesive layer 25 may be provided over the entire third face side as with the metallic layer 24 in FIG. 8, or may be provided on the first face in FIG. 3A.

The adhesive layer 25 is not limited as long as the substrate and the handling member are fixed, and the adhesive layer 25 has an adhesive force that can support the substrate 21 at the time of later processing of the substrate 21. However, with the later back face processing procedure of the substrate 21, heating and pressurizing processing is performed, whereby a resist, polyimide, heat-resistant wax, heat-resistant double-sided tape, and so forth are desirable. So that such a double-sided tape makes contact only with the channel protruding portion, the tape can be applied traversing the channels. The adhesive layer 25 can be more readily removed if thin, whereby the thickness of the adhesive layer is desirable to be 30 μm or less, and is more desirable to be 20 μm or less. However, in order to by thin and yet secure the adhesive force, the range of 1 to 20 μm is most desirable.

Further, as shown in FIG. 3B, the metallic layer 24 may be provided on the third face side and the adhesive layer 25 provided on top thereof. The adhesive layer 25 may be provided over the entire channel, but in the case of providing a metallic later, providing only to the channel protruding portion is desirable since the metallic layer can be readily removed.

On the other hand, hydrophilic processing may be performed as to the surface of the channel 23 of the handling member. Hydrophilic processing can be realized by performing UV cleansing, detergent cleansing, alcohol cleansing, plasma irradiation, HF processing, coating processing and so forth. By performing hydrophilic processing, the dissolving solution can be readily supplied to within the channels 23 at the time of removing the handling member. The hydrophilic processing can be performed directly as to the surface of the channel 23, or in the case of providing a metallic layer 24 on the surface of the channel 23, may be performed on the metallic layer 24.

Also, it is desirable for the handling member such as that described above to be larger than the substrate 21. When the handling member is larger than the substrate, the probability is reduced that jigs or tools will come in contact with the substrate at the time of handling and processing of the substrate 21. For example, in the case that the size of the substrate 21 is 4 inches, it is preferable for the size of the handling member to be roughly a 4-inch+2 cm size. Also, the thickness thereof is not particularly restricted, but should be of a thickness that the handling member is not broken. Normally a thickness of 200 μm or greater is desirable, and a thickness of 500 μm or greater is more desirable.

Figure 10:
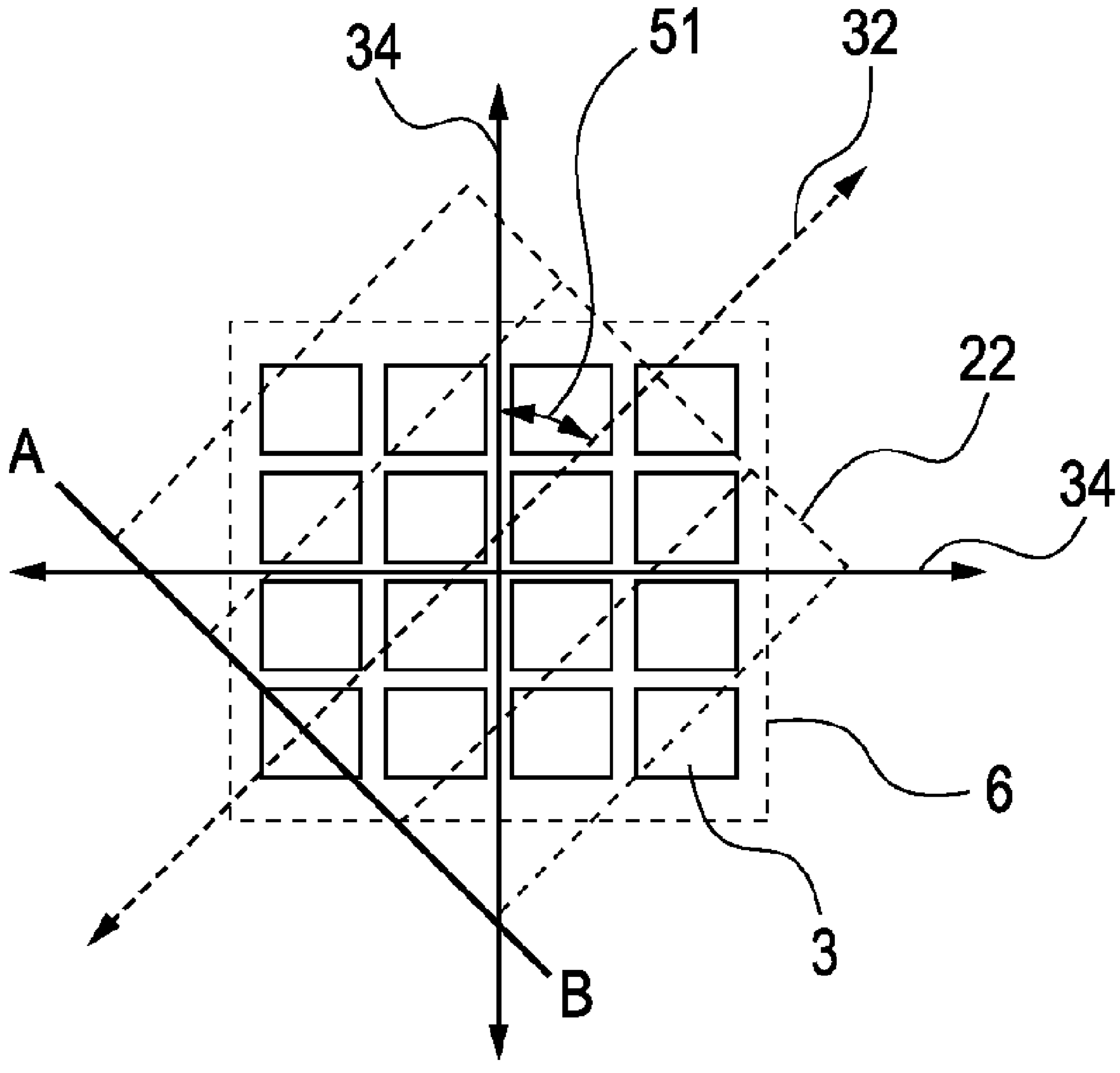
FIG. 10 is an example of the relation of the edge direction of a membrane supporting portion and the edge direction of a groove.

The fixing direction of the handling member and substrate will be described with reference to FIG. 10. FIG. 10 is a schematic diagram of a time wherein the edge direction 32 of the groove of the handling member is fixed so as to intersect as to the edge direction 34 of the membrane supporting portion of the substrate 21. Segment A-B in FIG. 10 shows the same portion as in FIG. 5, and the angle between the edge direction 34 of the membrane supporting portion and the edge direction 32 of the groove is indicated with reference numeral 51. In FIG. 10, the membrane 4, upper electrode 5, and so forth are omitted.

As shown in FIG. 10, the edge direction 34 of the membrane supporting portion and the edge direction of the element 6 are parallel. If the cavity shape is a quadrangle as in FIG. 10, there are two edge directions 34 of the membrane supporting portion, and if the cavity shape is a parallelogram or hexagon, there are three edge directions.

As described above, the handling member and substrate are fixed via an adhesive layer or an adhesive layer and metallic layer, and in the event of removing the handling member, a solution such that will separate the handling member from the substrate is supplied to the channel. In this event, if the edge direction of the membrane supporting portion and the edge direction of the groove match, force is applied to a position that is parallel to the edge direction of the membrane supporting portion, whereby pulling stress can be concentrated on the membrane of the upper edge portion (upper periphery of the cavity) of the membrane supporting portion. Particularly, in the case that the membrane is fabricated bent by the fabrication procedure of the substrate, even in a state wherein external force other than atmospheric force is not applied, the membrane has pulling stress working along the edge portion of the membrane supporting portion. In this event, upon attempting to remove the handling member, the adhesive layer expands. If the edge direction of the membrane supporting portion and the edge direction of the groove match, force is applied in a position parallel to the edge direction of the membrane supporting portion, from the expansion, whereby pulling stress is further concentrated on the membrane on the upper edge portion of the membrane supporting portion.

Thus, as in FIG. 10, by fixing the edge direction 34 of the membrane supporting portion and the edge direction 32 of the groove so as to intersect, whereby the pressure received by the membrane is not concentrated, and therefore the probability of membrane breakage can be reduced.

An angle such that the edge direction 34 of the membrane supporting portion and the edge direction 32 of the groove do not match differs by cavity shape, so the angle should be fixed within a range of appropriate desired angles. However, an angle wherein the smallest value of the angle forming the edge direction 34 of the membrane supporting portion and the edge direction 32 of the groove is 5 degrees or greater is desirable for stress to not concentrate therein, and an angle of 10 degrees or greater is more desirable. Also, in the case that the edge direction of the groove is in one direction and the cavity shape at the contact face with the membrane is a square, there is no particular limitation within the range of greater than 0 degrees and less than 90 degrees, but an angle within the range of 5 degrees or greater and 85 degrees or less is desirable for stress to not concentrate therein, and an angle of 10 degrees or greater and 80 degrees or less is more desirable. In the case that the edge direction of the groove is in one direction and the cavity shape at the contact face with the membrane is a hexagon, there is no particular limitation within the range of greater than 0 degrees and less than 60 degrees, but an angle within the range of 5 degrees or greater and 55 degrees or less is desirable for stress to not concentrate therein, and an angle of 10 degrees or greater and 50 degrees or less is more desirable. An angle of 0 degrees indicates an angle at the time that the edge direction 34 of the membrane supporting unit and the edge direction 32 of the groove match. Also, the direction to rotate can be two ways of rotation, of a clockwise rotation and a counter-clockwise rotation, centered around 0 degrees.

Figure 11:
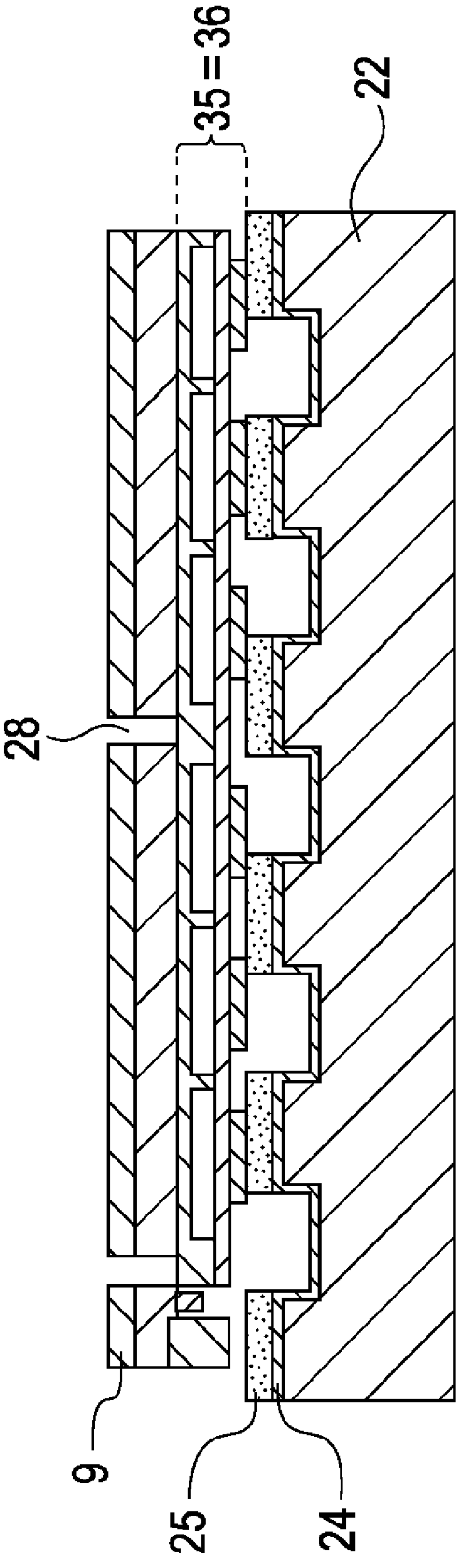
FIG. 11 is an example of a state after trench formation.

FIG. 11 is a schematic diagram of after processing the trench 28, and is the same diagram as that in FIG. 3D. At the time of trench 28 processing, first from the second face side, shaving and polishing is performed until the thickness of the silicon substrate 12 becomes a thickness of roughly 120 to 180 μm. Next, the trench 28 is provided so as to be separated at each element 6. The trench 28 can be fabricated by employing an etching technique, and performs processing up to a depth that arrives at the cavity base portion. When the spacing between the elements is great, the portion of the spacing (trench formed portion) cannot detect a signal, whereby a smaller trench width is desirable. Specifically, the width of the trench 28 is desirable to be 20 μm or less, and more desirable to be 5 μm or less. Further, 2 μm or less is most desirable. Finally, the lower electrode layer 9 for the purpose of taking out the signal is provided. The lower electrode layer 9 for the purpose of taking out the signal is formed by subjecting the protrusion portion already processed to evaporation coating in the order of titanium, copper, and silver, to respective thicknesses of roughly 200 A, 500 A, and 1000 nm. With such a process, the depth of the trench arrives at the insulating film of the vibrating portion, whereby the thicknesses of the trench forming portion 35 and vibrating portion 36 are roughly the same, and are often 1 μm or less.

After the trench 28 processing in FIG. 11, the substrate 21 is flip-chip-bonded to the integrated circuit 11 as shown in FIG. 3E. The bump 10 is not particularly limited as long as the lower electrode can be strongly joined to the integrated circuit 11. Generally, various types of bumps of various types of metals such as Zinc (Zn), Gold (Au), Silver (Ag), Copper (Cu), Tin (Sn), and Lead (Pb), or combinations thereof, are used. Also, even if flip-chip bonding is not used, any method to electrically connect the integrated circuit and electromechanical transducer, such as wire bonding, may be used.

Figure 12:
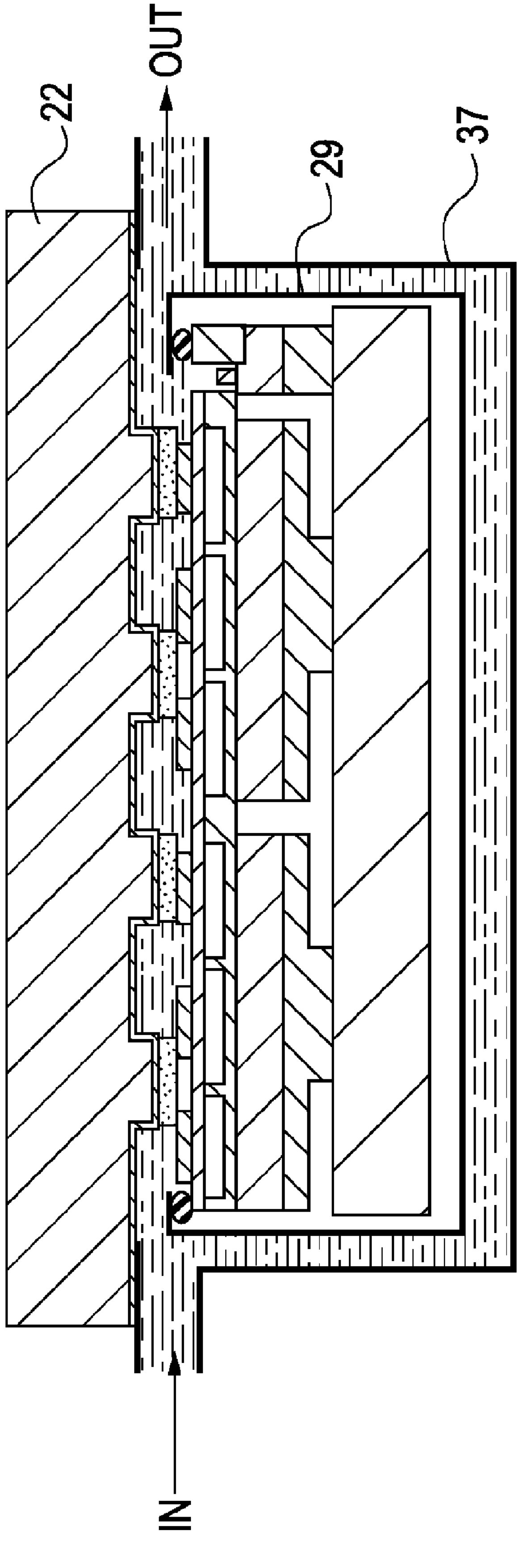
FIG. 12 is an example of a removal procedure (protection of the integrated circuit side).

FIG. 12 is a schematic diagram in the event of removing the handling member from the substrate 21. In order to remove the handling member, supplying a dissolving solution to the channel 23 of the handling member and dissolving the metallic layer 24 and adhesive layer 25 is desirable, so as not to break the integrate circuit 11 or substrate 21. In FIG. 12, after the flip chip bonding, the portion on the lower side from the membrane 4 (the portion other than the handling member) is covered with a protective case 29, and set in a container 37 filled with dissolving solution so that the edge of the handling member is outside of the container 37. Whether or not to use the protective case 29 only has to be determined according to the removal method or dissolving solution to be employed. Also, in the event of flip chip bonding, by employing an underfill (resin adhesive agent), the handling member can be removed without using the protective case 29.

The dissolving solution is guided by capillary action or natural diffusion into the channel 23 of the handling member. In order to more quickly guide the dissolving solution into the channel, external stimulation may applied to the container 37. The container 37 may be subjected to temperature change, whereby convection occurs in the dissolving solution, or the dissolving solution may be agitated with a magnet stirrer or vibrating apparatus. Also, after immersing the handling member in the dissolving solution, vapor within the channel can be removed by causing the atmosphere to become in a vacuum, thereby forcing the permeation of the dissolving solution into the channel. Further, applying pressure after temporarily causing a vacuum (or low pressure), or repeating these operations, is also effective. Also, a vibration such as an ultrasound wave may be applied to the container 37. Further, an entry and exit may be provided to the container 37, whereby the dissolving solution may be exchanged.

In order to remove the handling member more effectively, controlling the flow of dissolving solution within the channel 23 is desirable. By supplying the dissolving solution direction to the channel entry, the adhesive layer 25 and metallic layer 24 can be dissolved more quickly. However, the flow speed (flow pressure) is desirable to be such that the membrane 4 of the substrate 21 within the channel does not break. With a configuration such as shown in FIG. 12, as the dissolving of the metallic layer 24 and adhesive layer 25 advance a certain amount, the substrate 21 moves by its own weight to the base portion of the container 37. The handling member can be thus removed.

Figure 13:
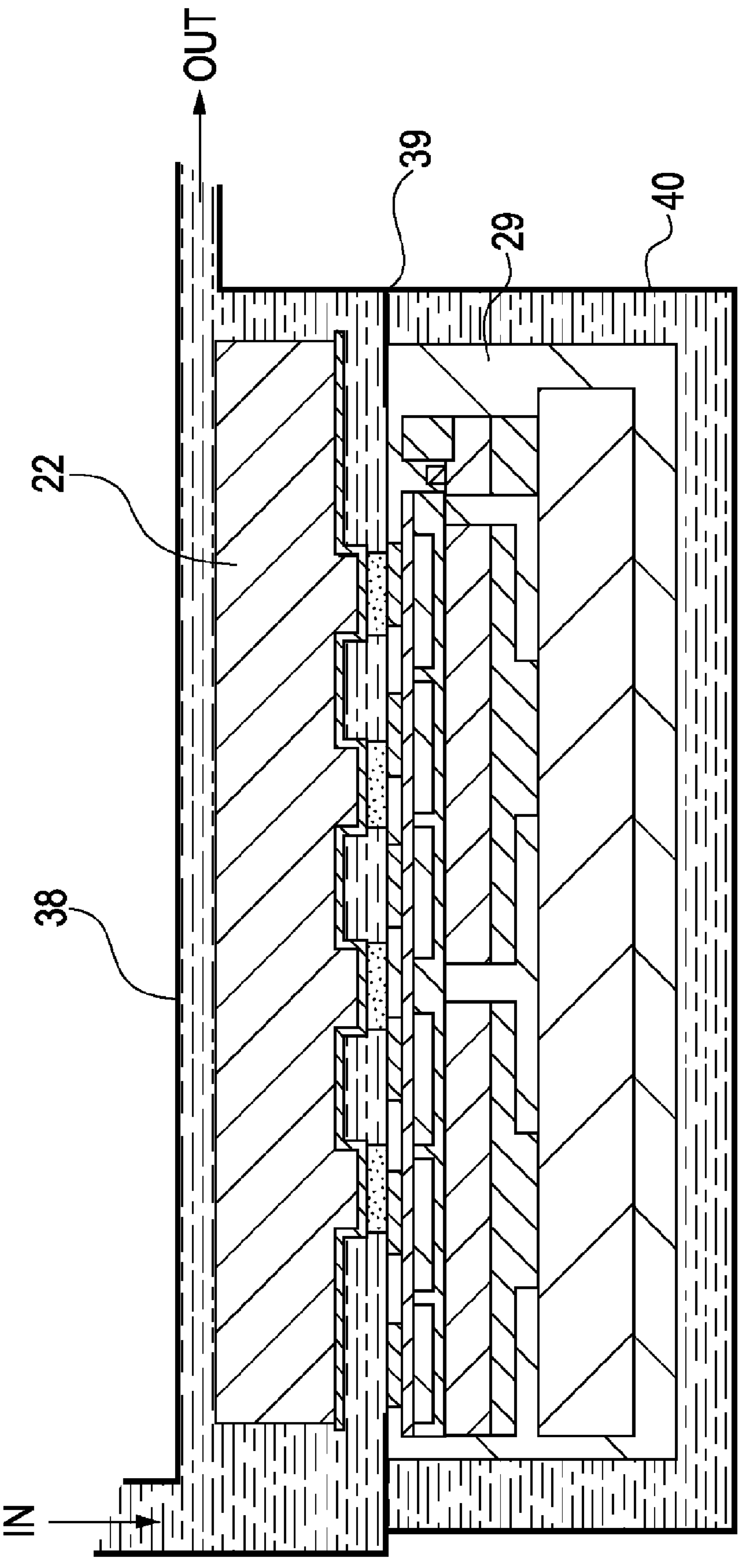
FIG. 13 is an example of the removal procedure (circulation system on the handling member side).

FIG. 13 is a schematic drawing showing a procedure wherein a container 38 filled with a dissolving solution is provided to the handling member side, with the container set on top of a container 40 filled with a protective solution and the dissolving solution is supplied thereto, whereby the handling member is removed by the weight of the substrate 21 itself.

It is desirable for a connecting position 39 for the container 38 to connect to the electromechanical transducer is desirable in a position so as to cover the spacing between the substrate 21 and the handling member (join so as to seal the space). A portion of the integrated circuit 11 is protected with the protective case 29. This is set so that the connection position 39 of the container 38 makes contact on top of the container 40 filled with protective solution on the substrate 21 side. If the dissolving solution is filled and circulated through the container 38 in this state, the substrate 21 sinks by its own weight into the container 40 that is filled with protective solution, as the dissolving of the metallic layer 24 and adhesive layer 25 advances a certain amount. The handling member can be thus removed. The protective solution is not particularly limited as long as the solution does not influence the substrate, such as causing corrosion or the like. For example, the solution may be water or may be a dissolving solution. In the case that the density of the protective solution is greater than the substrate 21, the substrate can be separated without sinking. In the case of having a metallic layer 24 and adhesive layer 25 on the third face, the protective solution can be a solution that can dissolve the adhesive layer 25, thereby realizing the quick removal of the handling member.

In the case that the handling member is fixed to the substrate 21 via multiple layers (metallic layer 24 and adhesive layer 25), first the solution that can dissolve the metallic layer 24 is supplied to the container 37 and container 38, and the handling member is removed. Next, the solution that can dissolve the adhesive layer 25 is supplied to each container, whereby the membrane 4 of the substrate 21 is exposed. The handling member removed from the substrate 21 with the above method can be removed from the substrate 21 without polishing, and accordingly can be reused.

Figures 20A, 20B:
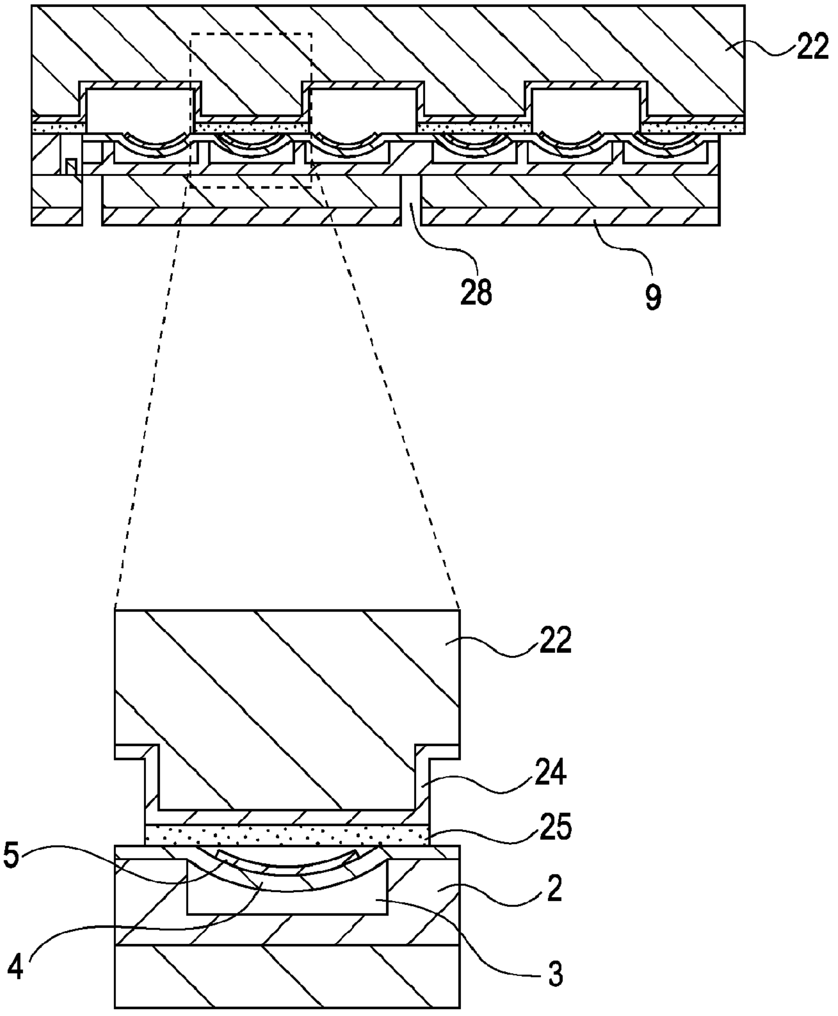
FIG. 20 is a fixing cross-sectional diagram of the handling member and substrate to be processed.

In the case that the membrane of the substrate 21 in FIG. 1A is fabricated under a pressure that is lower than that of the atmosphere, the device layer 16 (i.e. membrane) bends to the cavity side (i.e. the space side) by the atmospheric pressure, is deformed, and assumes a recessed shape. FIG. 20A illustrates the handling member fixed in this state. FIG. 20A is a cross-sectional diagram of the handling member and the substrate, and a diagram wherein a portion of the fixed portion is enlarged is shown in FIG. 20B. The state shown in FIG. 20 is desirable since the pressure applied to the membrane 4 can be reduced in the procedures after the subsequent back face processing and thereafter. Particularly, with the procedure to remove the handling member, the force applied to the membrane can be reduced.

First Embodiment

With the present embodiment, a fabrication method for an electromechanical transducing apparatus in the case of employing a handling member provided with an adhesive layer on the channel is described. The physical parameters of the substrate and the handling member are as follows.

(Settings for Substrate)
Base material for substrate . . . p-Type {100} silicon wafer
Size of substrate . . . 4 inches (10.16 cm)
Shape/size of cavity . . . square, 20 μm each side
Shape/width of element . . . rectangular, vertical width 0.505 mm, horizontal width 6.005 mm
Number of cavities within each element . . . 4,800 (20 rows, 240 columns)
Width of membrane supporting portion (spacing between cavity and cavity) . . . 5 μm
Distance between elements . . . vertical spacing 5 μm, horizontal spacing 5 μm
Number of elements within one substrate . . . 1,240 (124 rows, 10 columns)
(Settings for Handling Member)
Base material for handling member . . . synthetic quartz substrate
Size of handling member . . . diameter 12 cm, thickness 1 mm
Width of channel recessed portion . . . 200 μm
Width of channel protruding portion . . . 200 μm
Channel depth . . . 200 μm
Channel pitch . . . 400 μm
Number of channels . . . 300
(Settings for Adhesive Layer)
Form adhesive layer on channel recessed/protruding portions
Type of adhesive layer . . . polyresist
Resist thickness . . . 20 μm
(Settings for Dissolving Solution)
Acetone
(1) Fabrication Procedure for Substrate
(1-1) Preparation of Silicon Substrate Similar to FIG. 2A, the silicon substrate 12 is cleansed and prepared. Subsequently, a Si substrate surface is subjected to reduced resistance by diffusion or ion implantation.

(2) Fabrication of Membrane Supporting Unit

Similar to FIGS. 2B through 2D, the membrane supporting portion is fabricated, whereby the A substrate 15 is obtained.

(3) Fabrication of Cavity

Similar to FIG. 2E, an SOI waver is prepared, and is joined to the membrane supporting portion surface fabricated in (2). The joining herein is performed by activating the surface of the joining face at room temperature using an EVG 520 or the like manufactured by EV Group, and performed at 150° C. or less and $10^{-3}$ Pa. Next, the handling layer 18 of the joined SOI substrate is polished so that a thickness of several tens of μm remains, and is cleansed. Subsequently, a using a single-sided etching tool, the handling layer 18 is subjected to etching with a 80° C. KOH fluid while protecting the back face of the polished substrate. Next, the BOX layer 17 is subjected to etching with a fluid including hydrofluoric acid, the device layer 16 is exposed as shown in FIG. 2F, thereby forming the membrane 4 of the present embodiment.

(4) Fabrication of Electrode

Similar to FIG. 2G, the device layer 16 making up the membrane 4 is subjected to patterning by dry etching near the external peripheral rim of the membrane 4. Subsequently, the oxidizing film 13 is subjected to patterning by wet etching directly without removing the photoresist for patterning. With this procedure, the etching hole 19 is formed, as shown in FIG. 2G.

Next, a Cr film for an electrode is formed by sputtering, is subjected to patterning by wet etching, and an upper electrode 5, upper electrode pad 20, and lower electrode pad 8 such as shown in FIG. 2H are formed.

Lastly, in order to electrically separate the multiple cells in the present embodiment, the device layer 16 is subjected to patterning, and a substrate is completed. Note that the protective film of the electrical wiring provided thereupon or the electrical wiring between the upper electrode 5 and upper electrode pad 20 are not shown in the diagram.

Figure 14A:
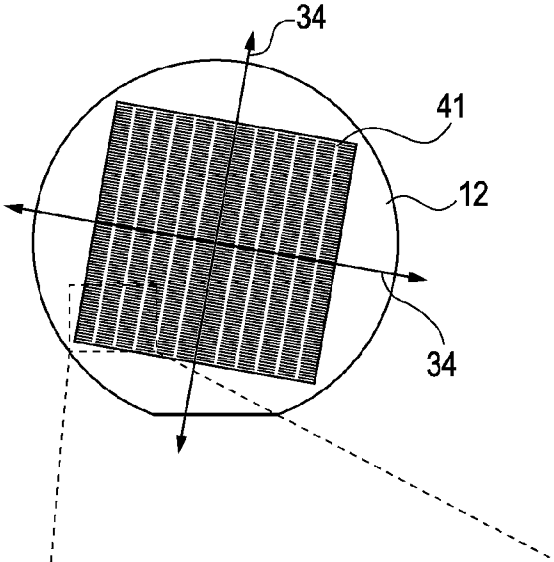
FIG. 14 is a schematic diagram of a substrate which is fabricated according to a first embodiment.
Figure 14B:
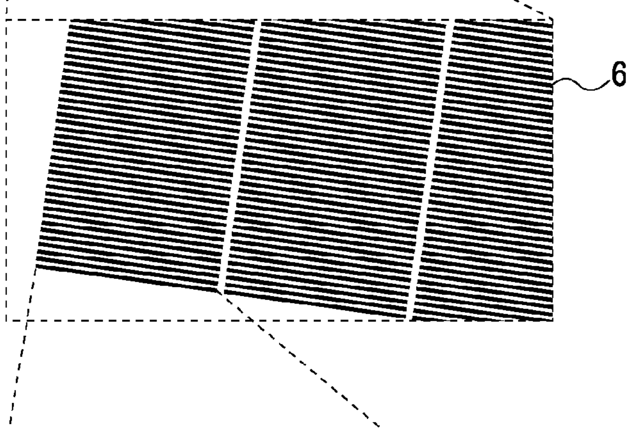
Figure 14C:
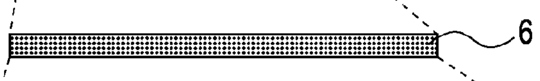
Figure 14D:
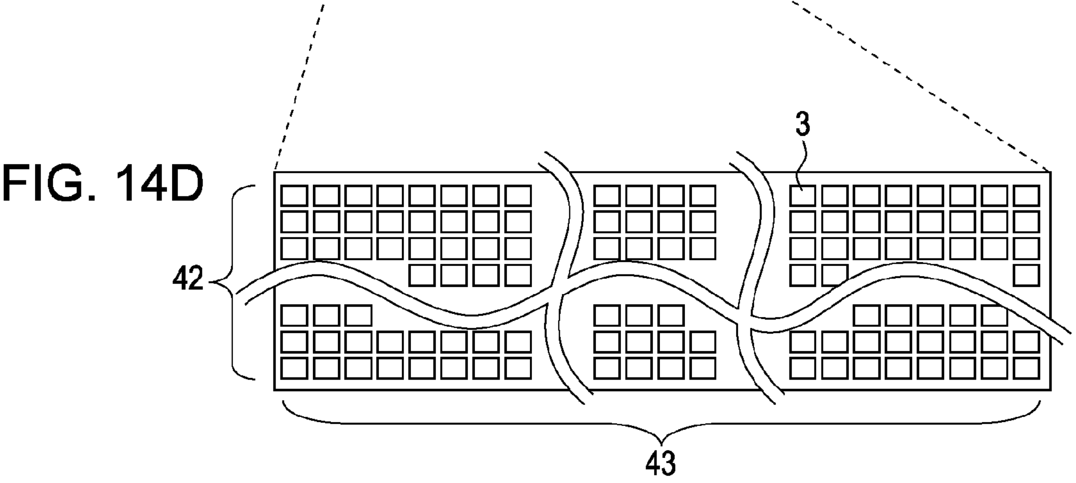

FIGS. 14A through 14D show schematic diagrams of the substrate 21 that is fabricated in the first embodiment. FIG. 14A shows the edge direction 34 of the membrane supporting unit of the substrate 21. FIG. 14B is a diagram wherein a portion of FIG. 14A is enlarged, and shows that the element 6 is formed on top of multiple silicon substrates. FIG. 14C is a schematic diagram of the shape of one element, and FIG. 14D shows specific locations of cavities (cells). Also in FIG. 14D, the upper electrode 5, upper electrode pad 20, lower electrode pad 8 and so forth are omitted.

Figure 15A:
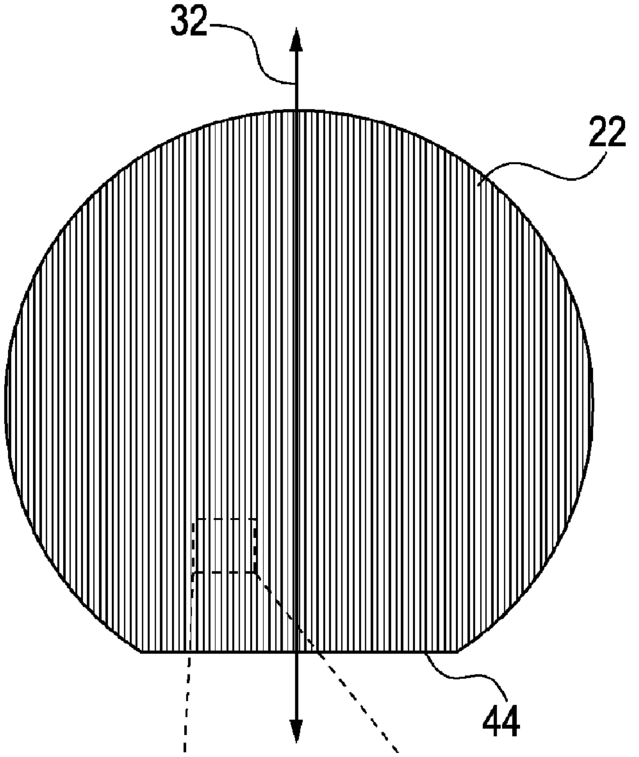
FIG. 15 is a schematic diagram of a handling member which is fabricated according to the first embodiment.
Figure 15B:
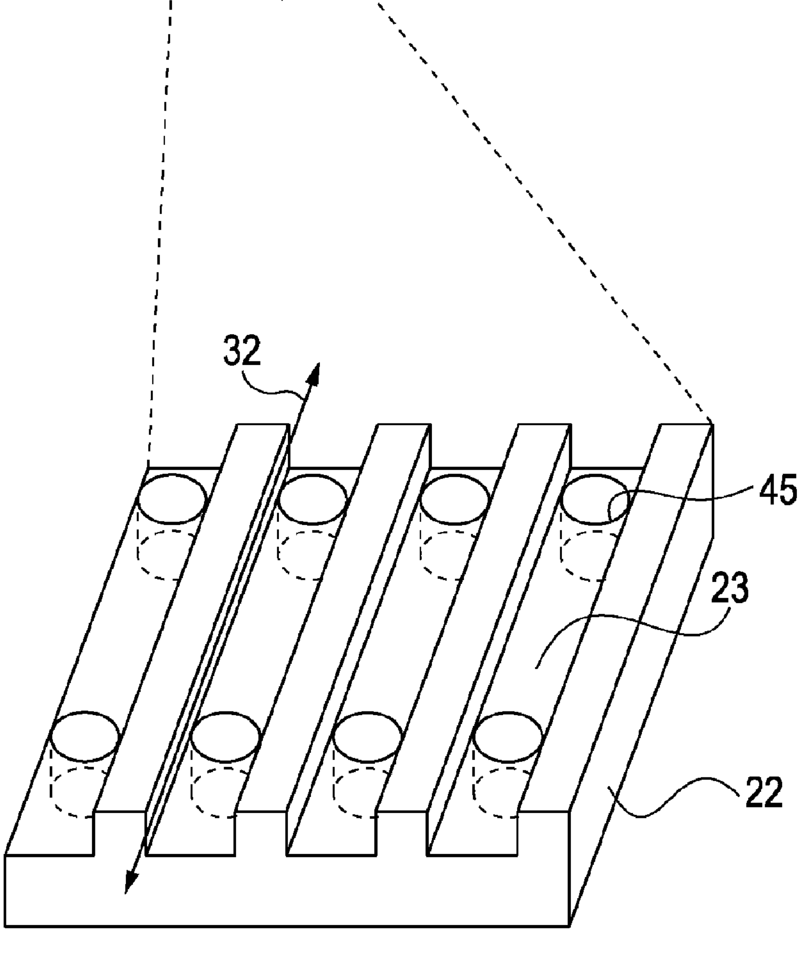

(2) Handling Member Fabrication Procedure (2-1) Fabrication of Handling Member Provided with Channel First, an already-cleaned synthetic quartz substrate is prepared. The size of the synthetic quartz substrate has a diameter of 12 cm and thickness of 1 mm. Cleaning is performed by performing ultrasound cleaning using neutral detergent and pure water, then after soaking in an alkali solution for a short period of time, again performs ultrasound cleaning using neutral detergent and pure water, and cleaning with running water. Next, a rectilinear channel with a width of 200 μm and depth 200 μm is fabricated by dicing on one face of the cleaned synthetic quartz substrate, so that the channel spacing becomes 200 μm. Following the dicing process, by cleaning the handling member that has be processed again, a handling member is obtained whereupon 300 rectilinear channels are provided. FIG. 15A is an external view schematic diagram of the handling member fabricated with the first embodiment. FIG. 15B is a schematic diagram wherein a portion of FIG. 15A is enlarged.

(2-2) Formation of Adhesive Layer

A polyresist is sprayed on so as to coat the channel recessed/protruding portions of the handling member providing the channels fabricated in (2-1), whereby an adhesive layer with a thickness of 20 μm is formed.

Figure 16:
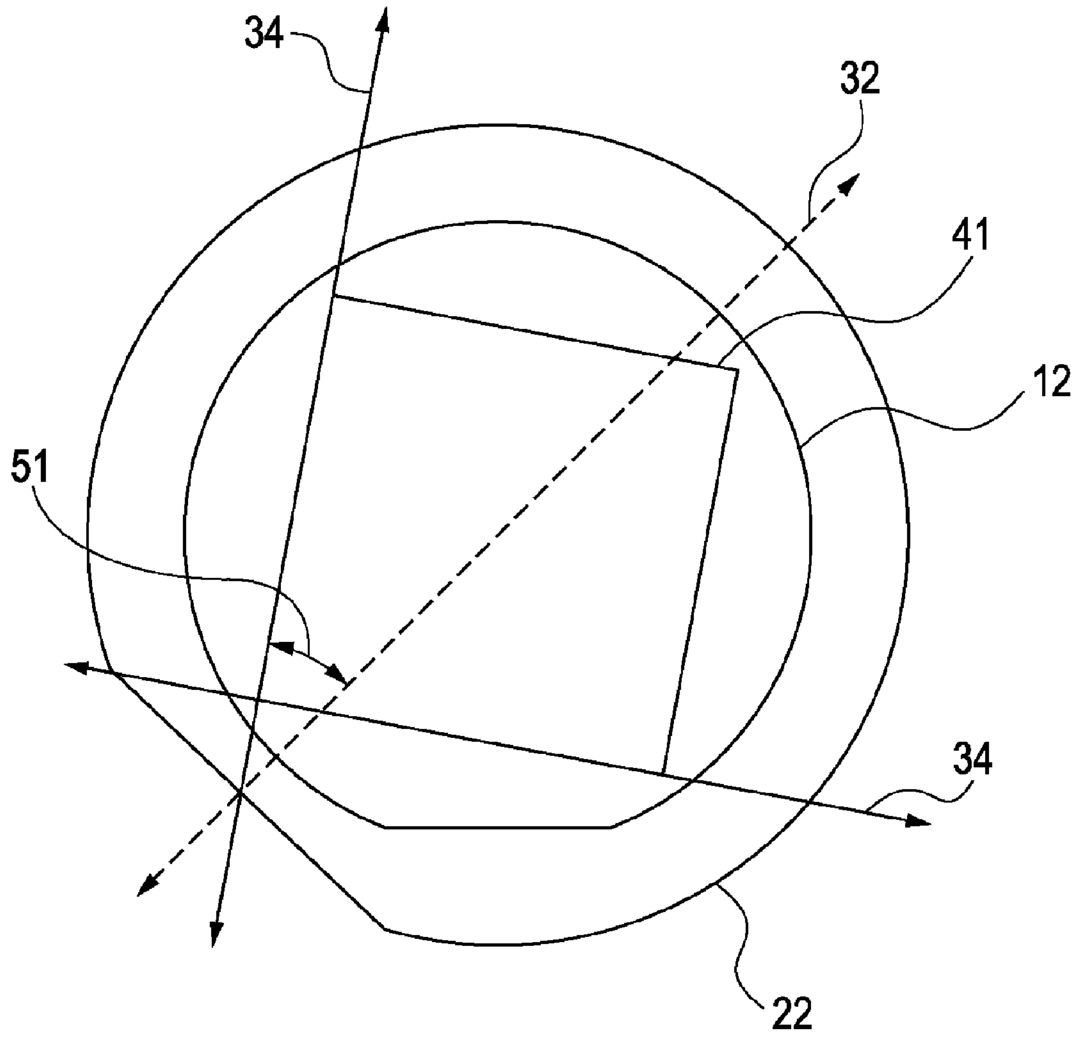
FIG. 16 is a schematic diagram of a fixing direction of the substrate and handling member according to the first embodiment.

(3) Fixing Procedure of Handling Member (3-1) Positioning of Substrate and Handling Member The edge direction 34 of the membrane supporting portion of the substrate that is fabricated in (1) and the edge direction 32 of the groove of the handling member that is fabricated in (2) are positioned so as to intersect with one another. Specifically, the substrate and the handling member are positioned to as to rotate in a clockwise direction, such that the angle 51 of the edge direction 32 of the groove and the edge direction 34 of the membrane supporting portion is 30 degrees. The angle herein may be accurately aligned, but may be positioned with an accuracy of ±10 degrees when viewed with the naked eye. FIG. 16 shows a schematic diagram of the positioning direction of the substrate and handling member according to the first embodiment. We can see that the edge direction 32 of the groove in the handling member does not match (i.e. intersects) the edge direction 34 of the membrane supporting portion.

(3-2) Fixing of Handling Member

While in the state that the substrate and the handling member are in contact, this is baked in an oven heated to roughly 115° C., thereby fixing the handling member to the substrate 21.

(4) Preparation of Integrated Circuit (4-1) Forming Flip Chip Pad onto Integrated Circuit The integrated circuit 11 is prepared, and a 5 μm Ni/Al layer is formed with a solder bump serving as a flip chip pad. Next, a Sn/Pb eutectic solder ball with a diameter of 80 μm is formed on the flip chip pad.

(5) Back Face Processing Procedure of Substrate (5-1) Back-grinding Procedure

The silicon substrate of the second face of the substrate to which the handling member is fixed in (3) is subjected to polishing until a thickness of roughly 150 μm remains.

(5-2) Trench Forming

Dry etching is performed down to the layer of the heat-oxidized film on the cavity side, and a trench portion is fabricated so as to separate each element. The width of the trench portion is 5 μm.

(5-3) Formation of Metallic Layer to Serve as Lower Electrode

The lower electrode layer 9 for taking out a signal is provided on the protruding portion of the second face, whereby films are formed such that Ti is 200 A, Cu is 500 A, and Au is 2000 A.

(5-4) Flip Chip Bonding

The position of the eutectic solder ball of the integrated circuit prepared in (4) and the position of the signal electrode layer are aligned. Subsequently, both are bonded with a force of roughly 4 g/bump at 150° C.

(6) Handling Member Removal Procedure (6-1) Protection of Integrated Circuit Side The portions other than the handling member of the substrate whereupon the integrated circuit is joined in (5) are covered with a protective case. The protective case is positioned so as to not make contact with the elements.

(6-2) Immersion in Dissolving Solution

A container 37 filled with acetone solution is prepared, such as shown in FIG. 12, and the substrate which is covered with the protective case in (6-1) is set on the container 37. The container 37 is connected to a circulating pump, and the acetone solution within is circulated by the pump. After a certain amount of time has passed, the amount of circulating acetone solution is reduced, and the state of dissolving of the adhesive layer is confirmed. Upon confirming several times, the substrate that is covered with the protective layer moves along with the reduction of the surface of the acetone solution within the container 37, and is separated from the handling member.

(7) Completion of Electromechanical transducing apparatus (7-1) Cleaning and Removal of Protective Case The substrate is cleaned while still covered with the protective case, and upon the protective case being removed, the electromechanical transducing apparatus is completed.

With a manufacturing method such as described above, the probability that the membrane 4 will break is reduced, and an electromechanical transducing apparatus to which an integrated circuit 11 is fixed can be manufactured.

Second Embodiment

The present embodiment describes a manufacturing method of an electromechanical transducing apparatus that employs a handling member provided with a metallic layer (Ge) on top of a channel (rectilinear-shaped channel+hold). The physical parameters of the substrate and the handling member are as follows.

(Settings for Substrate)

Base material for substrate . . . p-Type {100} silicon wafer

Size of substrate . . . 4 inches (10.16 cm)

Shape/size of cavity . . . hexagon of 125 μm each side

Shape/width of element . . . multi-angle, vertical width roughly 6 mm, horizontal width roughly 6 mm (see FIG. 17)

Number of cavities within each element . . . 780 (see FIG. 17)

Width of membrane supporting portion (spacing between cavity and cavity) . . . 5 μm Distance between elements . . . vertical spacing 5 μm, horizontal spacing 5 μm Number of elements within one substrate . . . 100 (10 rows, 10 columns)

(Settings for Handling Member)

Base material for handling member . . . synthetic quartz substrate

Size of handling member . . . diameter 12 cm, thickness 2 mm

Width of channel recessed portion . . . 1 mm

Width of channel protruding portion . . . 0.5 mm

Channel depth . . . 0.4 mm

Channel pitch . . . 1.5 mm

Number of channels . . . 80

Size of channel hole . . . diameter 1 mm

Pitch of channel holes . . . 5 mm (along each channel from each channel edge)

(Settings for Adhesive Layer)

Form Adhesive Layer on First Face

Type of adhesive layer . . . polyresist

Thickness of adhesive layer . . . 20 μm (Settings for Metallic Layer)

Form on Entire Channel Recessed/Protruding Portions

Type of metallic layer . . . Ge

Thickness of metallic layer . . . 2 μm (Settings for Dissolving Solution)

Dissolving solution for metallic layer . . . $H_2O_2$

Figure 17A:
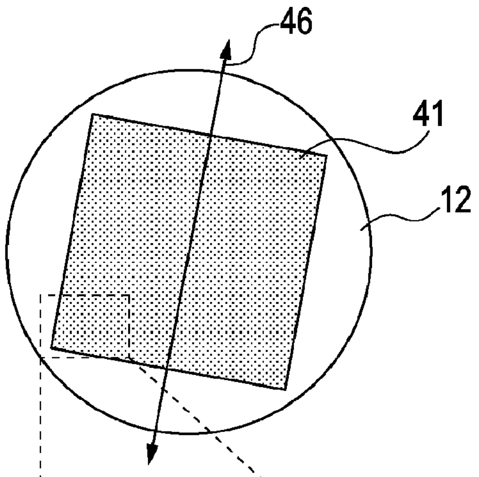
FIG. 17 is a schematic diagram of a substrate which is fabricated according to a second embodiment.
Figure 17B:
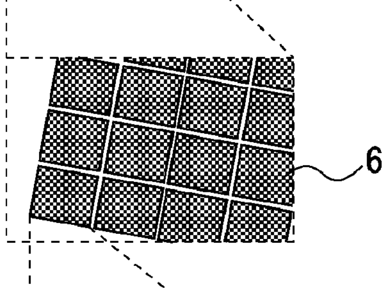
Figure 17C:
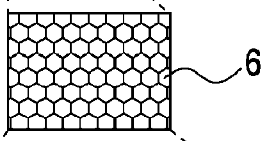
Figure 17D:
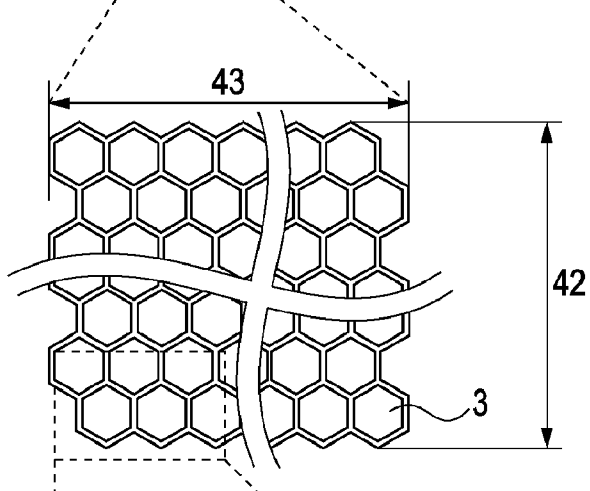
Figure 17E:
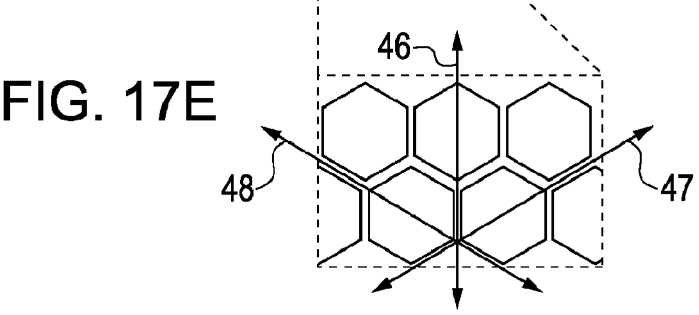

Dissolving solution for adhesive layer . . . acetone (1) Manufacturing Procedure of Substrate The substrate is prepared, similar to (1-1) through (1-4) of the first embodiment. Note that FIG. 17 shows a schematic diagram of the substrate that can be fabricated with the second embodiment. FIG. 17A shows the edge direction 46 of the first membrane supporting portion of the substrate 21. FIG. 17B is a diagram showing a portion of FIG. 17A enlarged, and shows that the element 6 is formed on multiple silicon substrates. FIG. 17C is a schematic diagram of one element shape, and FIG. 17D shows a specific state of a cavity (cell). Also, FIG. 17D omits the upper electrode 5, upper electrode pad 20, lower electrode pad 8, and so forth. FIG. 17E shows the edge directions of the membrane supporting portion in the case that the cavity shape is a hexagon. These are edge direction 46 of the first membrane supporting portion, edge direction 47 of the second membrane supporting portion, and edge direction 48 of the third membrane supporting portion.

Figures 18A, 18B:
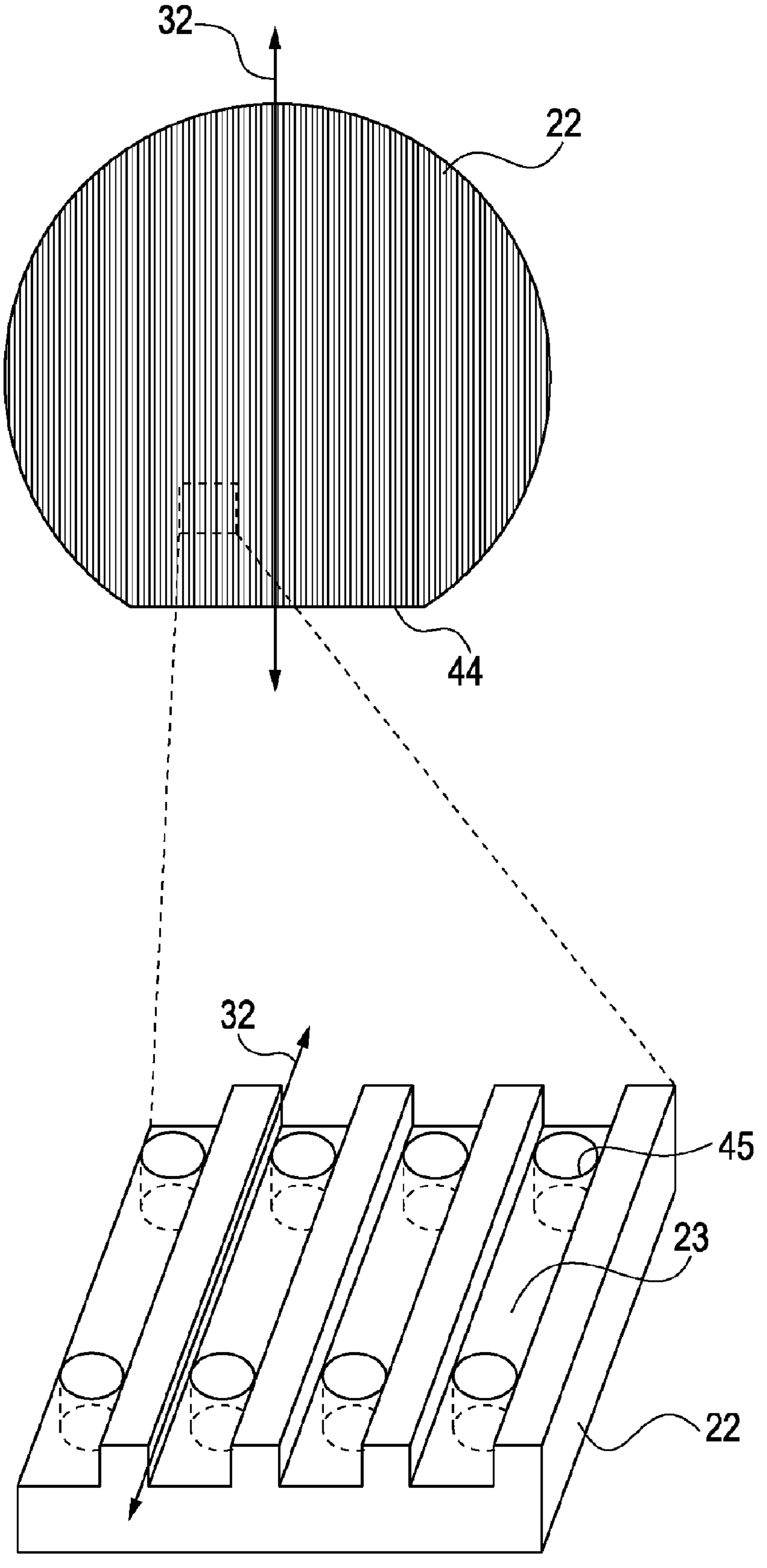
FIG. 18 is a schematic diagram of a handling member which is fabricated according to the second embodiment.

(2) Fabrication of Handling Member and Formation of Adhesive Layer on First Face (2-1) Handling Member Fabrication Procedure First, an already-cleaned synthetic quartz substrate is prepared with a diameter of 12 cm and thickness of 2 mm. Cleaning is performed by performing ultrasound cleaning using neutral detergent and pure water, then after soaking in an alkali solution for a short period of time, ultrasound cleaning is performed again using pure water and ultrapure water, and cleaning with running water. Next, a rectilinear channel with a width of 1 mm and depth 0.4 mm is fabricated by dicing on one face of the cleaned synthetic quartz substrate, so that the channel spacing becomes 1.5 mm. Following the dicing process, a through hole is formed with a $CO_2$ laser in the channel recessed portion. Through holes with a diameter of 1 mm are formed at 5 mm spacing from the channel recessed portion. Next, by cleaning the handling member that has been processed again, a handling member is obtained whereupon 80 rectilinear channels having through holes are provided. FIG. 18A is an external view schematic diagram of the handling member fabricated with the second embodiment. FIG. 18B is a schematic diagram wherein a portion of FIG. 18A is enlarged.

(2-2) Formation of Metallic Layer

A Ge film with thickness of 2 μm is formed by sputtering onto the channel recessed/protruding portions of the handling member and the through hole wall faces fabricated in (2-1).

(2-3) Formation of Adhesive Layer

A polyresist is sprayed on to coat the first face side of the substrate 21 that is fabricated in (1), and an adhesive layer 25 with a thickness of 20 μm is formed.

Figure 19:
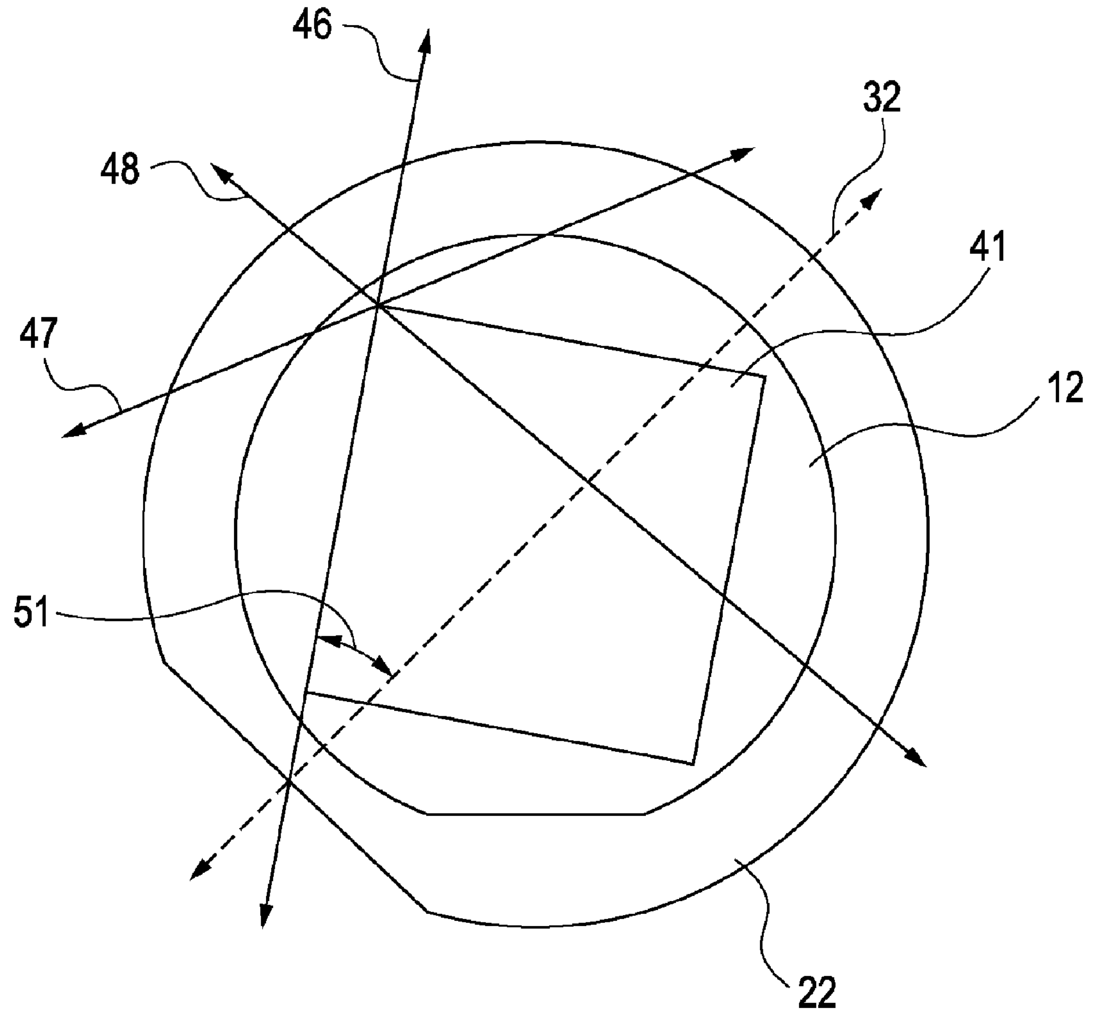
FIG. 19 is a schematic diagram of a fixing direction of the substrate and handling member according to the second embodiment.

(3) Fixing Procedure of Handling Member (3-1) Positioning of Substrate and Handling Member The edge direction 46 of the first membrane supporting portion of the substrate that is fabricated in (2-3) and the edge direction 32 of the groove of the handling member that is fabricated in (2-2) are positioned so as to intersect one another. Specifically, the substrate and the handling member are positioned to as to rotate in a clockwise direction, such that the angle 51 of the edge direction 32 of the groove and the edge direction 46 of the first membrane supporting portion is 30 degrees. The angle herein may be accurately aligned, but may be positioned with an accuracy of ±10 degrees when viewed with the naked eye. FIG. 19 shows a schematic diagram of the fixing direction of the substrate and handling member according to the second embodiment. We can see that the edge direction 32 of the groove in the handling member does not match the edge direction 46 of the first membrane supporting portion.

(3-2) Fixing of Handling Member

While in the state that the handling member is positioned on the substrate, this is baked in an oven heated to roughly 115° C. for approximately 30 minutes, thereby fixing the handling member to the substrate.

(4) Preparation of Integrated Circuit

The integrated circuit 11 is prepared, similar to (4) with the first embodiment.

(5) Back Face Processing Procedure of Substrate

The back face processing of the substrate is performed, similar to (5) in the first embodiment.

(6) Handling Member Removal Procedure (6-1) Protection of Integrated Circuit Side The portions other than the handling member of the substrate to which the integrated circuit is joined are covered with a protective case 29, similar to (6) in the first embodiment.

(6-2) Immersion of Metallic Layer in Dissolving Solution

A container 37 such as shown in FIG. 12 is prepared, and the substrate which is covered with the protective case in (6-1) is set on the container 37. The container 37 is connected to a circulating pump, hydrogen peroxide solution is supplied therein, and is circulated by the pump. After a certain amount of time has passed, the amount of circulating hydrogen peroxide solution is reduced, and the state of dissolving of the metallic layer is confirmed. Upon confirming several times, the substrate that is covered with the protective layer moves toward the bottom side of the container 37 along with the reduction of the surface of the hydrogen peroxide solution within the container 37, and is separated from the handling member.

(6-3) Immersion of Adhesive Layer in Dissolving Solution

Following removal of the handling member, the handling member is taken out of the container 37, and a lid is placed on the container 37. The hydrogen peroxide solution within the container 37 is removed, and an acetone solution is supplied thereto. Next, the acetone solution is circulated by the pump, and dissolves the resist that is adhered to the first face.

(7) Completion of Electromechanical transducing apparatus (7-1) Cleaning and Removal of Protective Case The substrate is cleaned while still covered with the protective case 29, and upon the protective case being removed, the electromechanical transducing apparatus is completed.

By fabricating as described above, the probability of a membrane breaking can be reduced, and an electric conversion apparatus that is fixed to an integrated circuit can be manufactured.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-165067 filed Jun. 24, 2008, which is hereby incorporated by reference herein in its entirety.

What is claimed is:

1. A manufacturing method of an electromechanical transducer, said electromechanical transducer having an element comprising:

a substrate;

a vibrating membrane; and a vibrating membrane supporting portion to support the vibrating membrane so that a space is formed between the substrate and the vibrating membrane;

said manufacturing method including fixing a handling member to a face on a vibrating membrane side of the element;

processing a face on an opposite side from the vibrating membrane side of the element; and removing the handling member from the element, wherein the handling member has a groove including a rectilinear edge on a face to be fixed to the element, and in the fixing of the handling member, the groove configures a portion of a channel to externally communicate in a state of the handling member being fixed to the element, and wherein the handling member is fixed so that an edge direction of the vibrating membrane supporting portion and an edge direction of the groove of the handling member intersect, and wherein a solution for removing the handling member from the element is supplied to the groove in the removing of the handling member.

2. The manufacturing method of an electromechanical transducer according to claim 1, wherein an angle formed by the edge direction of the vibrating membrane supporting portion and the edge direction of the groove of the handling member is 5 degrees or greater.

3. The manufacturing method of an electromechanical transducer according to claim 2, wherein the angle formed by the edge direction of the vibrating membrane supporting portion and the edge direction of the groove of the handling member is 10 degrees or greater.

4. The manufacturing method of an electromechanical transducer according to claim 1, wherein, in the fixing of the handling member, the handling member is fixed to the element via an adhesive layer, and wherein, in removing of the handling member, a dissolving solution to dissolve the adhesive layer is supplied to the channel as the solution to remove the handling member from the element.

5. The manufacturing method of an electromechanical transducer according to claim 1, wherein, in the fixing of the handling member, the handling member is fixed to the element via a metallic layer and an adhesive layer, and wherein, in the removing of the handling member, a dissolving solution to dissolve the metallic layer is supplied to the channel as the solution to remove the handling member from the element.

6. The manufacturing method of an electromechanical transducer according to claim 1, wherein, in the processing of the face on the opposite side, an integrated circuit is fixed to the face on the opposite side.

* * * * *